(12) United States Patent
Nagatomo et al.

(10) Patent No.: US 7,816,062 B2
(45) Date of Patent: Oct. 19, 2010

(54) METHOD AND APPARATUS FOR SEMICONDUCTOR DEVICE PRODUCTION PROCESS MONITORING AND METHOD AND APPARATUS FOR ESTIMATING CROSS SECTIONAL SHAPE OF A PATTERN

(75) Inventors: Wataru Nagatomo, Yokohama (JP);
Hidetoshi Morokuma, Hitachinaka (JP);
Atsushi Miyamoto, Yokohama (JP);
Hideaki Sasazawa, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 929 days.

(21) Appl. No.: 11/592,175

(22) Filed: Nov. 3, 2006

(65) Prior Publication Data
US 2007/0105243 A1     May 10, 2007

(30) Foreign Application Priority Data
Nov. 4, 2005     (JP) .............................. 2005-320319

(51) Int. Cl.
*G03F 9/00* (2006.01)
*G03C 5/00* (2006.01)
*G21G 5/00* (2006.01)

(52) U.S. Cl. ..................... 430/30; 430/296; 430/311; 430/942; 250/492.3; 382/145; 382/147

(58) Field of Classification Search .................. 430/30, 430/296, 311, 942; 250/492.3; 382/145, 382/147
See application file for complete search history.

(56) References Cited

U.S. PATENT DOCUMENTS
2005/0116182 A1* 6/2005 Tanaka et al. ............ 250/492.1

FOREIGN PATENT DOCUMENTS
JP      10-125749       5/1998
JP      2000-348658     12/2000

* cited by examiner

*Primary Examiner*—Christopher G Young
(74) *Attorney, Agent, or Firm*—Antonelli, Terry, Stout & Kraus, LLP.

(57) ABSTRACT

In an exposure process or etching process, an image feature amount useful for estimating a cross-sectional shape of a target evaluation pattern, process conditions for the pattern, or device characteristics of the pattern is calculated from an SEM image. The image feature amount is compared with learning data that correlates data preliminarily stored in a database, which data includes cross-sectional shapes of patterns, process conditions for the patterns, or device characteristics of the patterns, to the image feature amount calculated from the SEM image. Thereby, the cross-sectional shape of the target evaluation pattern, the process conditions of the pattern, or the device characteristics of the pattern are nondestructively calculated.

27 Claims, 20 Drawing Sheets

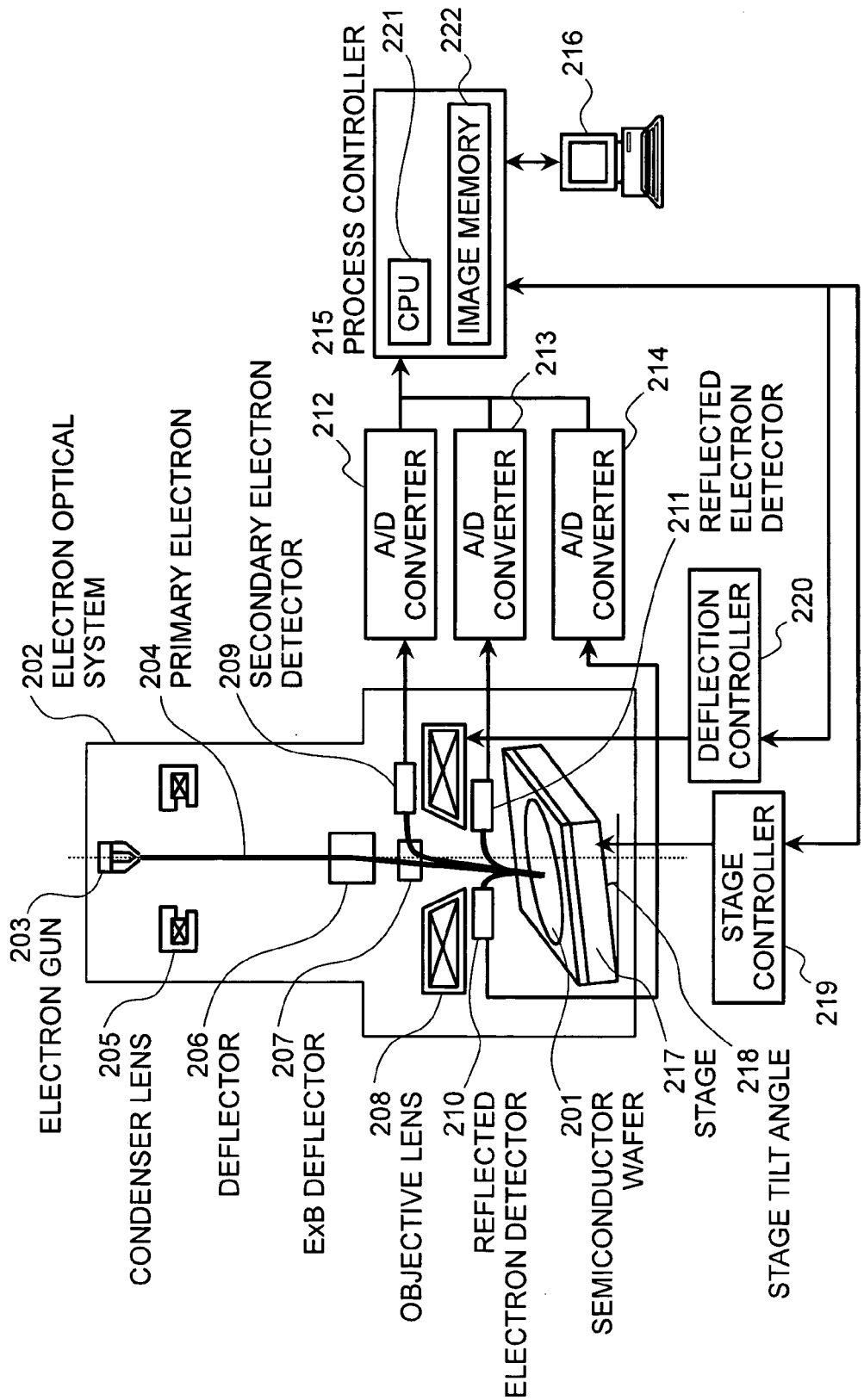

UPPER: CROSS-SECTIONAL SHAPE
LOWER: LINE PROFILE

Top-down View

Tilt View

Top-down View

Tilt View

Top-down View

Tilt View

FIG.13A
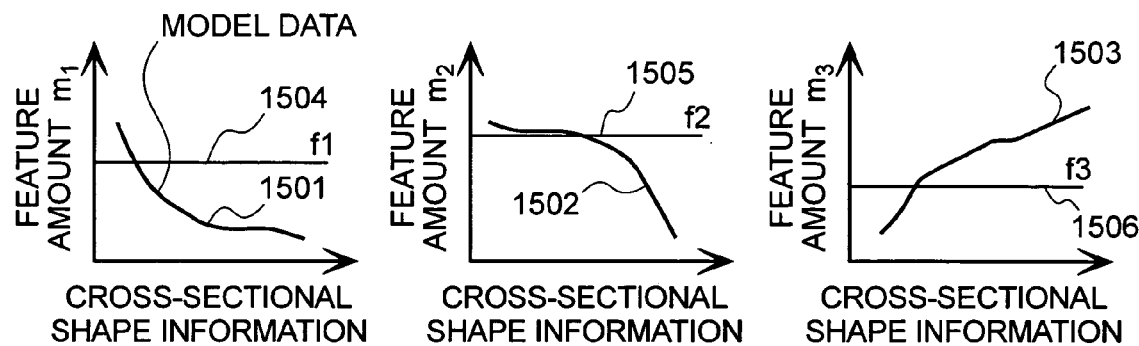
FIG.13B
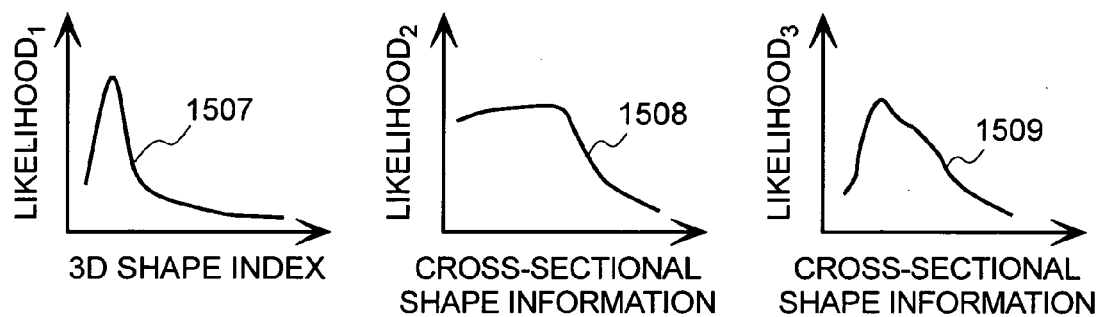
FIG.13C
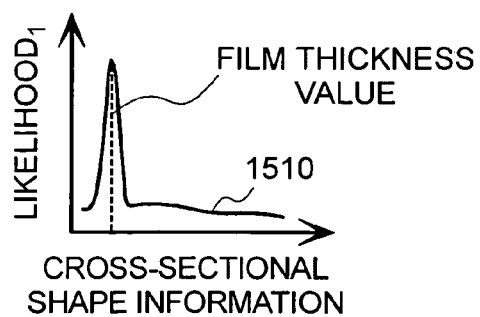

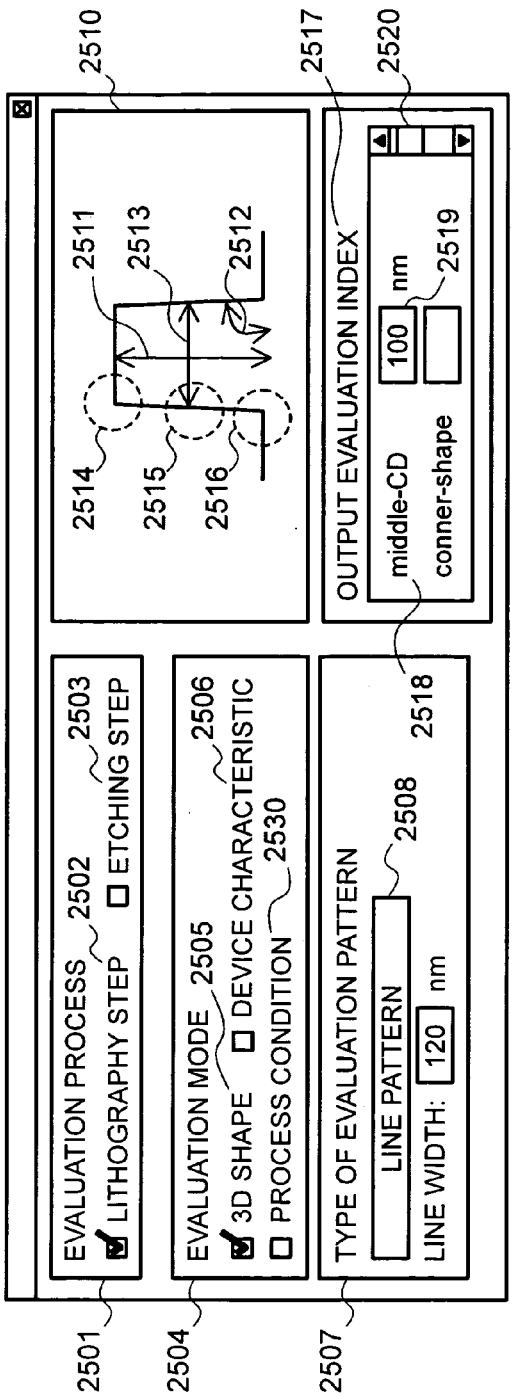
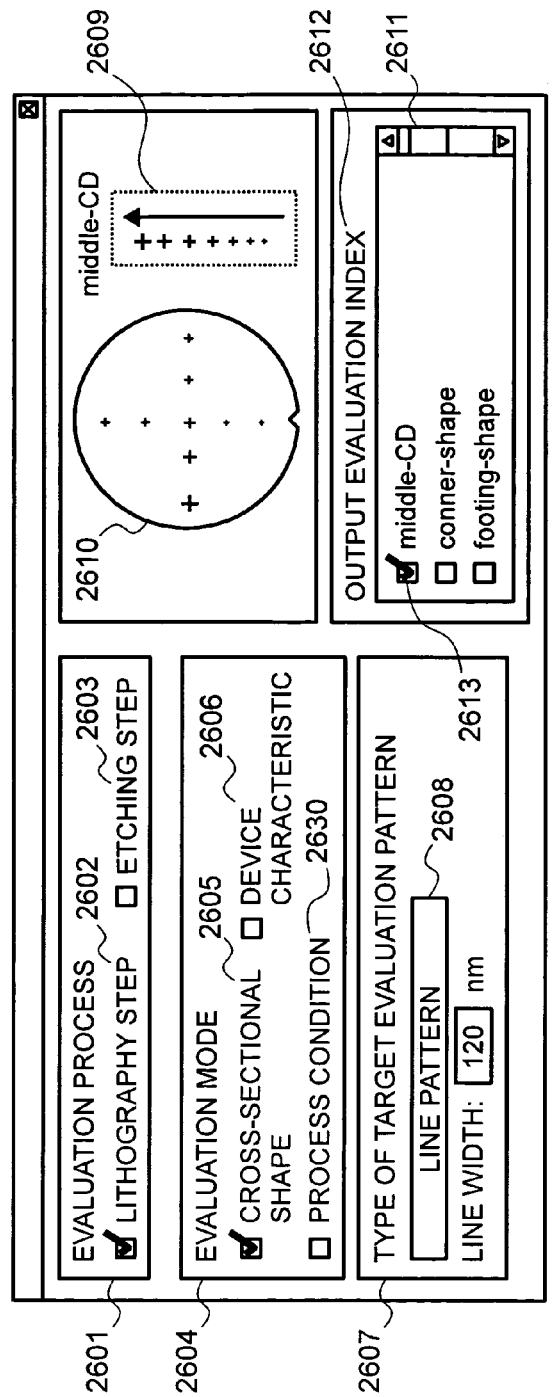
FIG.19
FIG.20

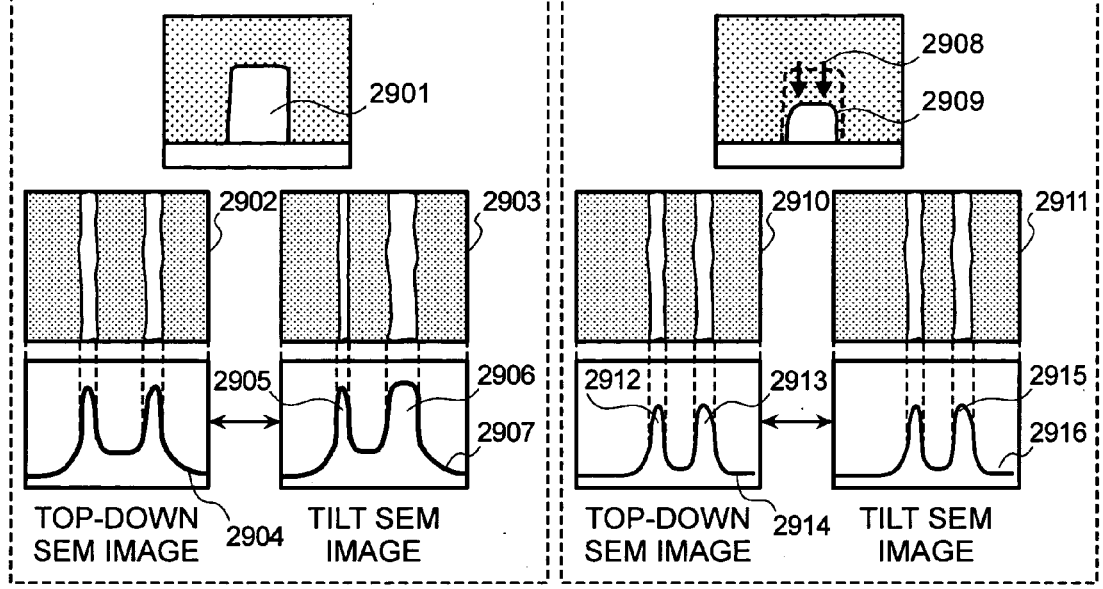
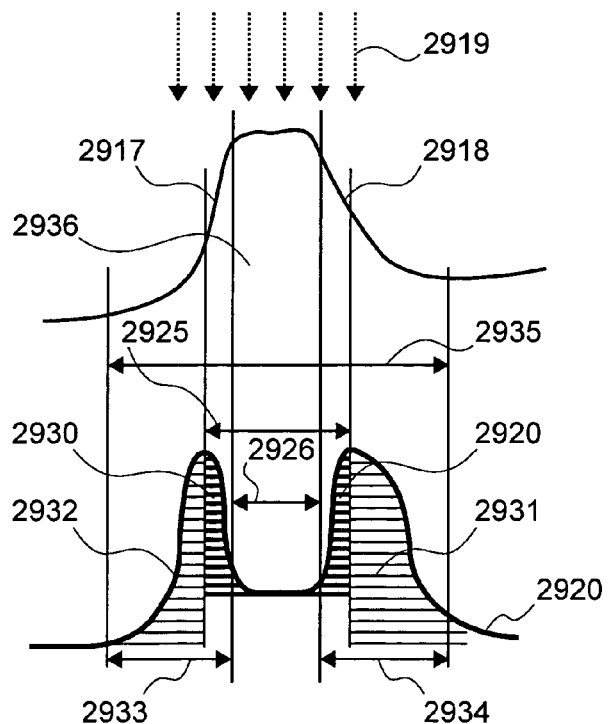
FIG. 21A PATTERN A — TOP-DOWN SEM IMAGE / TILT SEM IMAGE
FIG. 21B PATTERN B — TOP-DOWN SEM IMAGE / TILT SEM IMAGE
FIG. 21C
UPPER: CROSS-SECTIONAL SHAPE
LOWER: LINE PROFILE

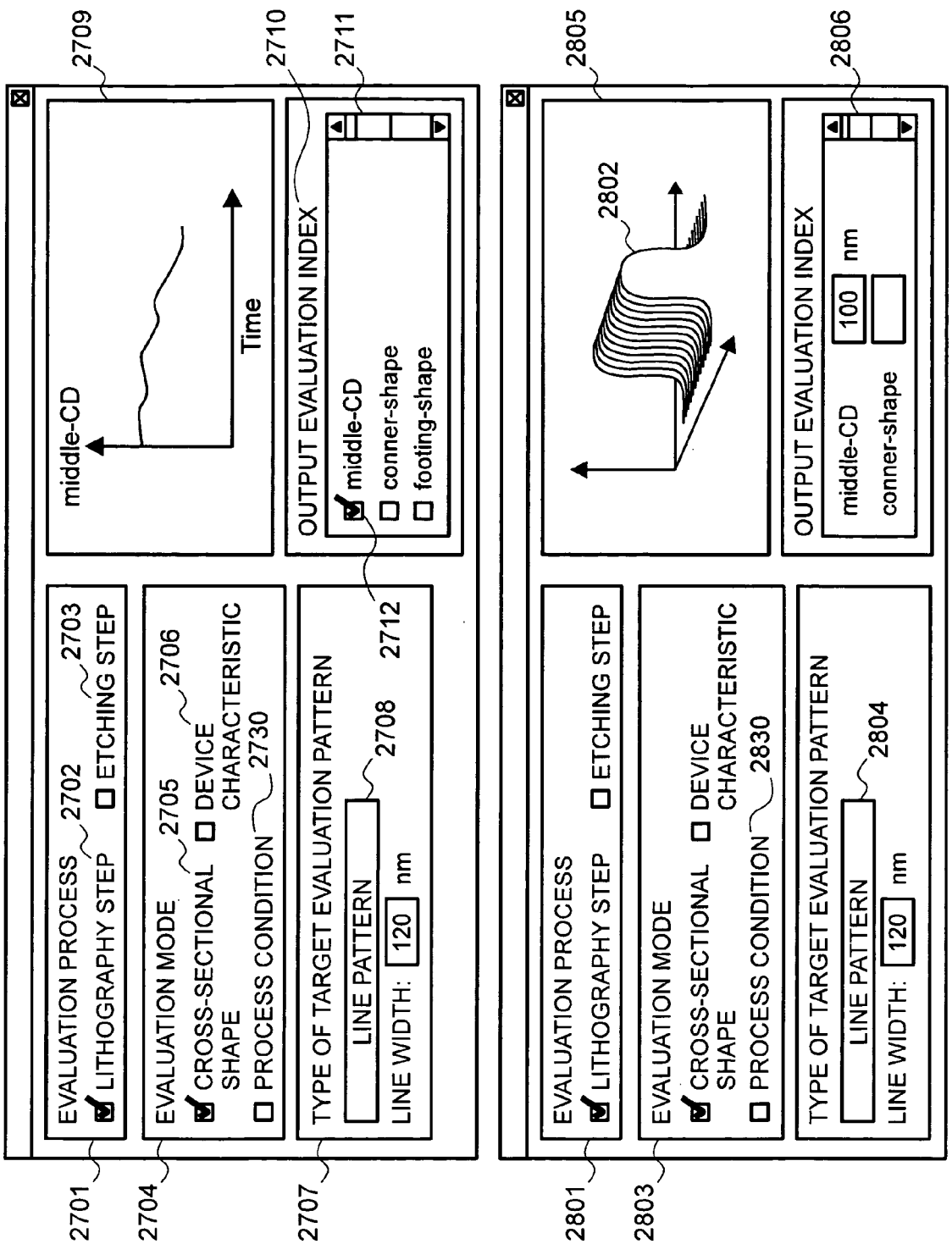

METHOD AND APPARATUS FOR SEMICONDUCTOR DEVICE PRODUCTION PROCESS MONITORING AND METHOD AND APPARATUS FOR ESTIMATING CROSS SECTIONAL SHAPE OF A PATTERN

BACKGROUND OF THE INVENTION

The present invention relates to a method and apparatus for semiconductor device production process monitoring (or, a "semiconductor device production process monitoring apparatus and method," hereafter) for performing evaluation and management of a circuit pattern in a semiconductor device production process; and also relates to a method and apparatus for estimating a cross-sectional shape of a pattern. More specifically, the present invention relates to a technique effective for pattern cross-sectional shape management by a length-measurement or metrological SEM (scanning electron microscope), process condition management, and device characteristics management.

Conventionally, the device characteristics of transistors are primarily dependent on the gate wireline width (gate length), and in the semiconductor device production process, the pattern line width is measured and controlled by using a metrological SEM (scanning electron microscope/microscopy). However, with recent rapid progress in the miniaturization of semiconductor circuit patterns, the transistor channel lengths become smaller, such that, as factors determining the device characteristics, not only the wire line width, but also the cross-sectional shape significantly affects the pattern. The following describes the management of the patterns of semiconductor devices in semiconductor production steps.

FIGS. 1A to 1J show examples of normal and abnormal cross-sectional shapes of semiconductor devices. FIG. 1A shows an example of a cross-sectional shape generally considered to be most desirable among patterns of semiconductor devices being formed. In this case, the tilt angle of the respective pattern sidewall is substantially vertical. In addition, the sidewall is substantially perpendicular to a base plane in a pattern bottom portion 102, and a pattern upper plane and the pattern sidewall are substantially perpendicular to one another in a pattern upper portion 101. In comparison, FIGS. 1B to 1J, respectively, show examples of patterns that, among patterns of semiconductor devices, are generally classified as abnormal shapes and that can cause cases in which desired device characteristics cannot be obtained. However, depending on the case, pattern shapes such as shown in FIGS. 1B to 1J are intentionally formed to form desired circuits.

More specifically, FIG. 1B is a pattern in which the tilt angle of the pattern sidewall is less than 90 degrees. Such a pattern shape is referred to as an "ordinary taper" shape (pattern). FIG. 1C is a pattern in which the tilt angle of the pattern sidewall is greater than 90 degrees. Such a pattern shape is referred to as a "backward taper" shape (pattern). FIG. 1D is a pattern of a shape in which a pattern central portion is narrow, and the pattern sidewall is bowed inward. Such a pattern shape is referred to as a "bowing" shape (pattern). FIG. 1E is a pattern of which corner shapes in the pattern upper portion are rounded. Such a pattern shape is referred to as a "top-rounding" shape (pattern). FIG. 1F is a pattern having a shape in which the corner portions overhang. Such a pattern shape is referred to as an "overhang" shape (pattern). FIG. 1G is a pattern having a shape in which feet in a pattern bottom portion are trailed such as to form a skirt. Such a pattern shape is referred to as a "skirt-trailed" shape (pattern). FIG. 1H is a pattern having a shape in which sidewall portions coming to cross with the lower-base face are bent inwardly of the sidewalls in the pattern upper portion. Such a pattern shape is referred to as a "notch" shape (pattern). FIG. 1I shows patterns having a shape in which the pattern height is less than a desired pattern height. Such a pattern is referred to as a "film-reduced pattern." FIG. 1J shows two patterns, one having a pattern width is greater than a desired pattern width, and the other having a pattern width less than the desired pattern width.

The shapes of FIGS. 1A to 1J are examples of abnormal shapes occurring with inappropriate conditions of the semiconductor device production process. In a circuit pattern of a semiconductor device, the gate length coincident with the dimension of the pattern bottom portion, such that it is important to measure the dimension of the bottom portion. However, in a gate forming process, ions are implanted with the wireline pattern being used as a mask, thereby forming the source and drain of the transistor. As such, the tilt of the pattern sidewall, the shape of the pattern bottom portion, and the like affect the process result of the step of ion implantation, thereby resulting in variations in the device characteristics, such that it is important to manage the cross-sectional shape of the gate pattern.

Further, in the exposure process, the pattern is transferred onto the resist by using the exposure mask, and performs development based on the transferred pattern, thereby to form a resist pattern. A ground film is etched in a subsequent etching process with a subsequently formed resist pattern being used as a mask pattern. As such, in the event that abnormality exists in the cross-sectional shape of the resist pattern, abnormality can be potentially induced in the etching pattern of the ground film in the subsequent step of etching. Thus, cross-sectional shape evaluation is very important in either the gate forming or exposure process. A technique similar to the conventional technique described above is disclosed in Japanese Unexamined Patent Application Publication No. 10-125749, for example.

SUMMARY OF THE INVENTION

However, in most cases, the conventional metrological SEM is used for measuring dimensions of 2D (two-dimensional) shapes, such as line widths of wireline patterns and hole diameters or sizes of contact holes, from the top-down direction. With such a conventional manner, it is difficult to implement evaluation and management of cross-sectional shapes such as described above. Problems with such the conventional manner for implementing the evaluation and management of the cross-sectional shapes are summarized as follows:

(1) It is difficult to measure cross-sectional shapes of formation patterns, process parameters for forming of the patterns, or device performances of the patterns from SEM images taken from the top-down direction (which SEM images hereinbelow will each be referred to as a "top-down SEM image");

(2) No methods are available to make the go/no-go decision for the formation patterns in accordance with cross-sectional shapes of formation patterns, process parameters for forming of the patterns, or device performances; and 3) No methods are available that, when a defect is found with a formation pattern, calculates the adjustment amount of the process conditions causing the pattern formation defect for feeding back to the process.

In view of the problems described above, the present invention provides a method and apparatus for semiconductor device production process monitoring, in which, in an exposure process or etching process, cross-sectional shapes of formation patterns, process parameters, or device performances of the patterns are estimated and managed by using an metrological SEM. According to one aspect of the present invention, an apparatus for semiconductor device production process monitoring includes the following means: means of obtaining SEM images of patterns of various cross-sectional shapes, patterns formed under various process conditions, or patterns of various process conditions; means of calculating an image feature amount that quantifying a feature of a respective one of the SEM images; means of registering or storing in a database a correlation ("learning data," hereinafter) between the respective image feature amount and a cross-sectional shape, process conditions, or device performances; means of calculating an image feature amount from an SEM image of a target evaluation pattern; and means of estimating a cross-sectional shape, process conditions, or device performances of the target evaluation pattern in accordance with the learning data registered or stored in the database.

By necessity, the apparatus for semiconductor device production process monitoring is configured to include some or all of the following means: estimating means that presents to a user a result of estimation performed by the means of estimating ("estimating means," hereinafter); determining means that makes a go/no-go decision of whether the result of the estimation by the estimating means falls within a desired allowable range; calculating means that calculates an adjustment amount for process conditions for the exposure process, etching process, or the like process in accordance with the result of go/no-go decision made by the means of making a go/no-go decision ("determining means," hereinafter) for the target evaluation pattern; feedback means that feeds back the adjustment amount to an exposure apparatus or etching apparatus; calculating means that calculates an adjustment amount for process conditions for the exposure process, etching process, or the like process in accordance with a deviation of the result of estimation performed by the estimating means from an optimal value; and feedback means that feeds back the adjustment amount.

According to the present invention, cross-sectional shapes of patterns, or process conditions, or some or all of device characteristics can be managed nondestructively with high throughput. Further, the go/no-go decision of the formation pattern, or the deviation (amount) from the optimal value is calculated in accordance with the calculation results described above, and by necessary, the adjustment amount for the exposure process, etching process, or the like process (such as exposure mask designing process) is calculated, and the adjustment amount is fed back thereto, thereby making it possible to implement high-level process management.

These and other objects, features and advantages of the invention will be apparent from the following more particular description of preferred embodiments of the invention, as illustrated in the accompanying drawings.

BRIEF DESCRIPTION OF THE DRAWINGS

In the accompanying drawings:

FIG. 2 shows a configuration overview of a system for realizing the present invention;

FIG. 13A is a graph showing the relationship between an image feature amount and cross-sectional shape information of learning data containing various items of data of cross-sectional shapes;

FIG. 13B is a graph showing an image feature amount and a likelihood distribution corresponding to cross-sectional shape information calculated from fluctuations thereof in units of each item of learning data;

FIG. 13C is a graph showing a likelihood distribution obtained through multiplication of likelihood distributions;

FIG. 19 is a view showing another embodiment of an input GUI;

FIG. 20 is a view showing an embodiment of an output GUI;

FIG. 21A is view showing a cross section SEM image, top-down image, and tilt image of a target evaluation pattern A;

FIG. 21B is view showing a cross section SEM image, top-down image, and tilt image of a target evaluation pattern B;

FIG. 21C is a cross sectional view of a target evaluation pattern, which shows the relationship between a pattern and irradiation electron beams when obtaining a tilt SEM image;

FIG. 22 is a view showing another embodiment of an output GUI;

FIG. 23 is a view showing still another embodiment of an output GUI;

DETAILED DESCRIPTION OF THE PREFERRED EMBODIMENTS

Figure 1A:
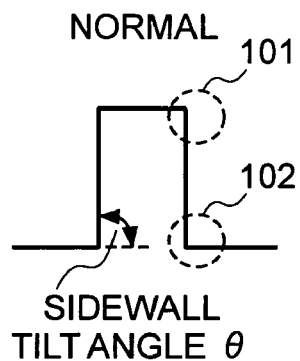
FIG. 1A shows an example of a cross-sectional shape generally considered to be most desirable among patterns of semiconductor devices formed.

Embodiments of the present invention will be described with reference to the accompanying drawings.

(Configuration of Metrological SEM)

FIG. 2 shows blocks in a configuration overview of a SEM (scanning electron microscope) for obtaining SE (secondary electron) images or BSE (backscattered electron) images of samples in accordance with the present invention. An SE and BSE image is generically referred to as an "SEM image." An image to be obtained in the present case includes all or part of a top-down image ("top-down SEM image," hereafter), which is an image of a measurement target vertically observed, or a tilt image ("tilt SEM image," hereafter) of a measurement target observed from an arbitrary tilt angle direction.

Numeral 203 denotes an electron gun that generates a primary electron beam 204. A deflector 206 and an objective lens 208 are used to control an irradiation position and aperture of the electron beam so that the electron beam is irradiated in focus on an arbitrary position on a semiconductor wafer 201, which is a sample, placed on a stage 217. A secondary electron and a reflected electron are ejected from the semiconductor wafer 201, and the secondary electron is detected by a secondary electron detector 209. The reflected electron is detected by reflected electron detectors 210 and 211. The reflected electron detectors 210 and 211 are disposed on the directions different from one another.

The secondary and reflected electrons detected by the secondary electron detector 209 and the reflected electron detectors 210 and 211 are, respectively, converted by A/D (analog to digital) converters 212 to 214 to digital signals. The digital signals are stored in an image memory 222, and then are image-processed by a CPU (central processing unit) 221 correspondingly to the purpose.

Figure 3B:
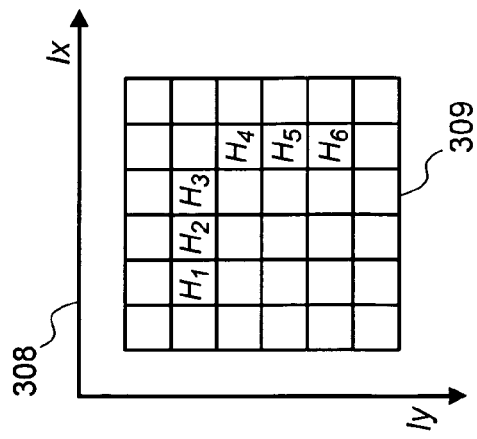
FIG. 3B is view showing the states of respective pixels of an image detected electrons emitted from the semiconductor wafer upon being irradiated with the electron beams.
Figure 3A:
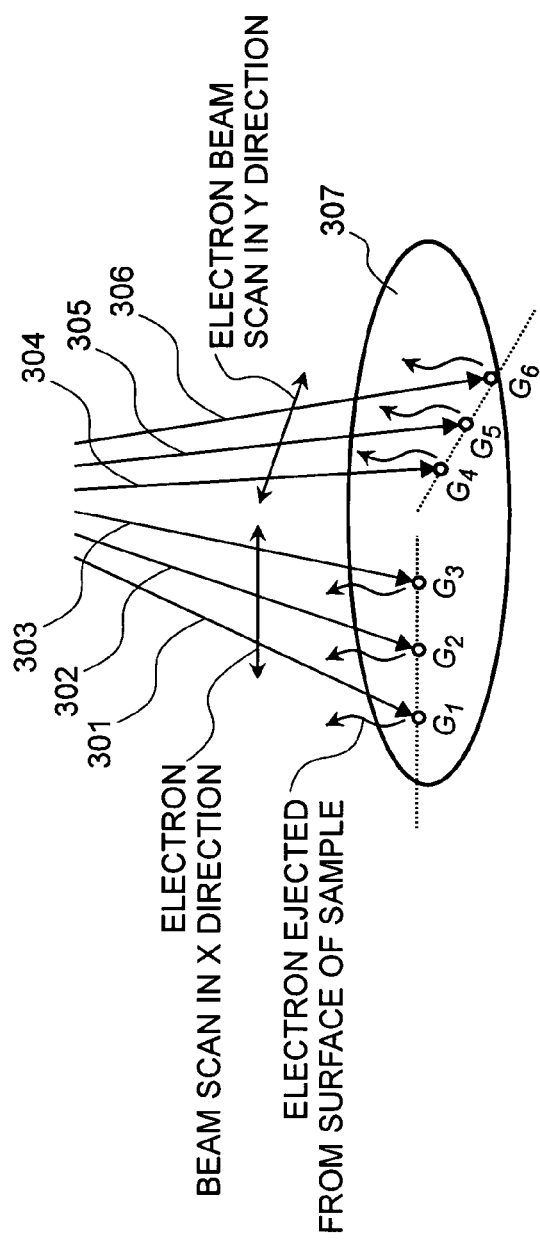
FIG. 3A is view showing the state where electron beams are irradiated on a semiconductor wafer.

FIGS. 3A and 3B show a method of imaging the amount of signal ejected from the surface of a semiconductor wafer in the event that an electron beam is scanned and irradiated on the surface of the semiconductor wafer. For example, as shown in FIG. 3A, electron beams are scanned in the x or y direction and irradiated as electron beams 301 to 303 or 304 to 306. The scan direction can be altered by altering the deflection direction of the electron beam. Sites irradiated with the electron beams 301 to 303 scanned in the x direction are, respectively, indicated by numerals G1 to G3. Similarly, sites irradiated with the electron beams 304 to 306 scanned in the y direction are, respectively, indicated by numerals G4 to G6. The amounts of signal ejected at the sites G1 to G6 correspond to luminance values of pixels H1 to H6 of an image 309 that are, respectively, shown in FIG. 3A, 3B (lower-right affixed numbers 1 to 6 to letters G and H correspond to one another). Numeral 308 denotes the coordinate system indicating the x, y direction on the image.

In FIG. 2, numeral 215 denotes a computer system that sends control signals to, for example, a stage controller 219 and a deflection controller 220 for imaging a sample in accordance with an imaging recipe, or alternatively, performs processes and control, such as various image processes, on an observation image formed on the semiconductor wafer 201. The computer system 215 (or, "processor and controller") is connected to a display 216, and includes a GUI (user graphic interface) that causes display of images and the like for users. As described above, numeral 217 represents the stage (specifically, "x-y stage") that moves the semiconductor wafer 201, thereby to make it possible to image an image in an arbitrary position on the semiconductor wafer 201. Shift of the observation position by using the x-y stage 217, hereinbelow, will be referred to as "stage shift," and shift of the observation position through deflection of the electron beam by using the deflector 206, hereinbelow, will be referred to as "beam shift."

Whereas FIG. 2 shows the embodiment including two reflected-electron image detectors (reflected electron detectors 210 and 211), the number of reflected-electron image detectors can be either reduced or increased. In addition, some or all of the processes and control in the processor and controller 215 can be implemented by being allocated or distributed to a plurality of processing terminals.

Methods of obtaining a tilt image (tilt SEM image) of a measurement target observed from an arbitrary tilt angle direction by using the apparatus shown in FIG. 2 include the following:

(1) Method of capturing a tilt image in the manner that an electron beam to be irradiated through an electron optical system is deflected, and an irradiation angle of the electron beam is set to a tilt angle (as disclosed in Japanese Unexamined Patent Application Publication No. 2000-348658); and
(2) Method of tilting the stage 217 itself (in FIG. 2, the stage 217 is tilted at a tilt angle 218);
(3) Method of mechanically tilting an electron optical system itself.

(Semiconductor Device Production Process Monitoring Apparatus)

Figure 4:
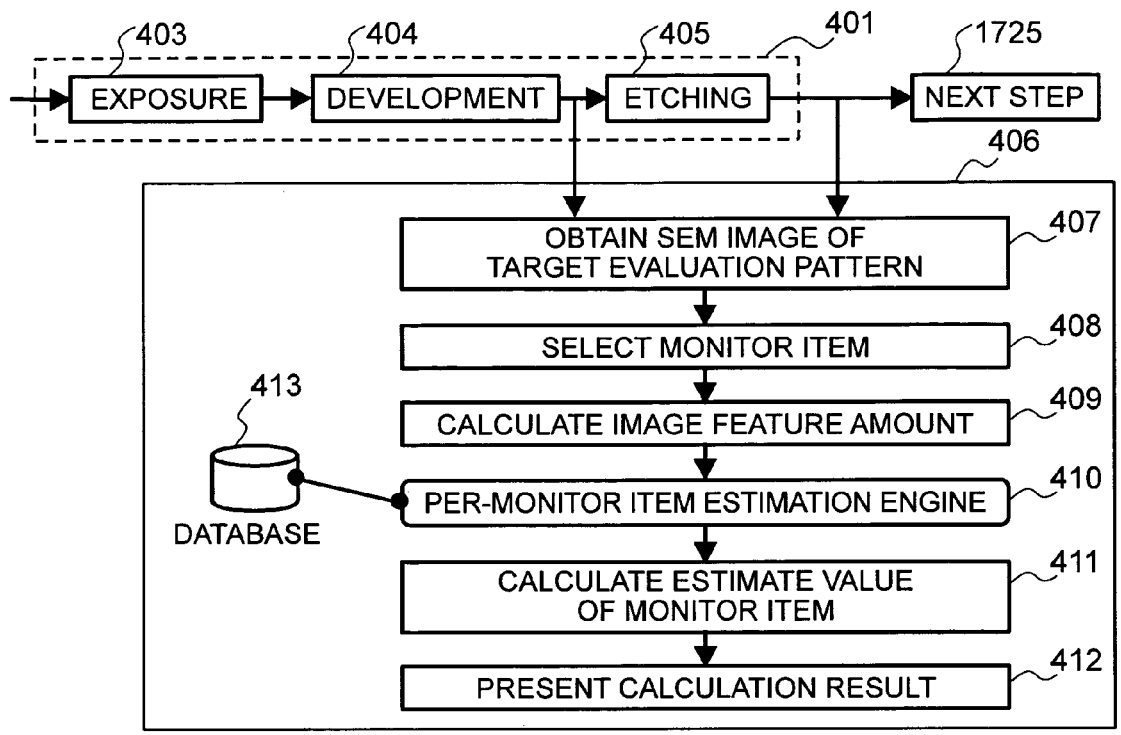
FIG. 4 is a view showing an overall configuration of an apparatus for semiconductor device production process monitoring.

With reference to FIG. 4, the following describes an overview of a semiconductor device production process monitoring apparatus 406 (or, simply "apparatus" or "process monitoring apparatus," hereafter) according to an embodiment of the present invention. The apparatus 406 has a feature that nondestructively monitors monitor items (cross-sectional shapes of patterns, or process conditions, or some or all of device characteristics) of a pattern formed in an exposure process or etching process. Thereby, the apparatus 406 enables performing various types of measurement and evaluation effective to verify a pattern formation state in accordance with the calculation result of the monitor items. A portion 401 surrounded by the broken line shows a processing flow of a semiconductor production process. According to the flow, exposure (step 403 (term "step" will be omitted hereinbelow unless otherwise necessary)) and development (404) are performed to thereby form a resist pattern, and etching (405) is performed with the resist pattern, whereby a circuit pattern is formed.

In the present embodiment, an SEM image of the resist pattern formed after development or an SEM image of the circuit pattern formed after etching (each of which hereinbelow will be referred to as a "target evaluation pattern) is obtained (407). Then, a respective monitor item is selected (408). In this event, a monitor item desired by a user is selected by the user. Then, a per-unit item calculation process is executed in units of the selected monitor item in accordance with the obtained SEM image (409), thereby to obtain an image feature amount. Then, a respective estimate value is calculated (411) for the monitor item for the target evaluation pattern. The calculation is performed by a per-unit item estimation engine 410 by using a lastly calculated image feature amount and estimation learning data (learning data representing correlations between monitor items and image feature amounts) preliminarily registered or stored in a database 413. In addition, the calculation result is, by necessity, is on-screen displayed thereby to be presented to the user in accordance with an on-screen display manner described below (412).

(Semiconductor Device Production Process Monitoring Method)

As described above, the semiconductor device production process monitoring apparatus 406 calculates estimate values for monitor items (cross-sectional shapes of patterns, or process conditions, or some or all of device characteristics), and present the calculation result to the user in accordance with the on-screen display manner described below. The following now describes a semiconductor device production process monitoring method (or, simply "method," or "process monitoring method," hereafter) for executing process monitoring in the manner that the monitor item calculated in the above-described manner is used to thereby feed back a process condition adjustment amount to previous one of the processes.

Figure 14:
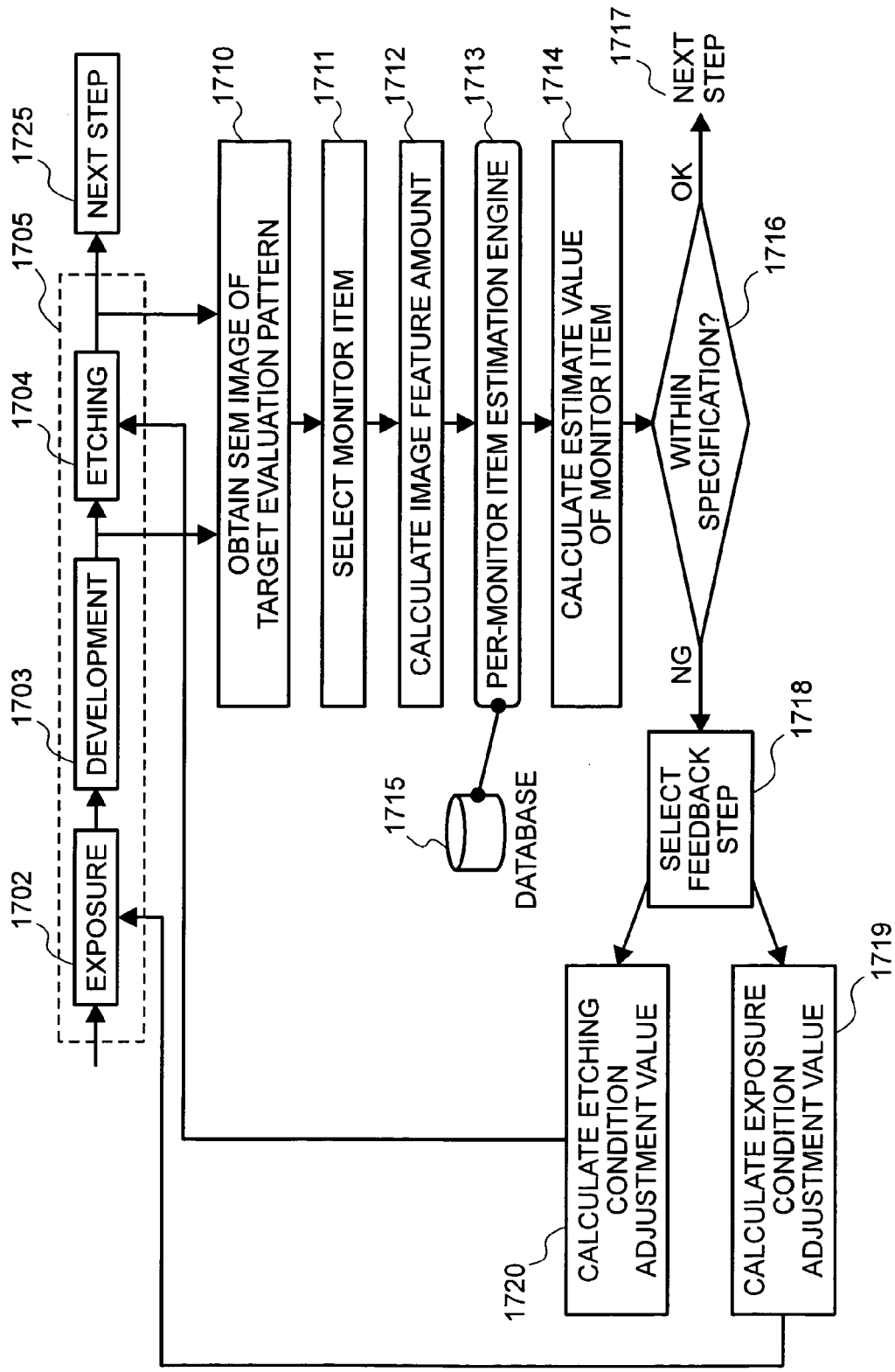
FIG. 14 is a diagram showing a flow of a process of a process monitoring method.

FIG. 14 is an explanatory view of the semiconductor device production process monitoring method according to an embodiment of the present invention. A portion 1705 surrounded by the broken line shows a processing flow of a semiconductor production process. According to the flow, exposure (1702) and development (1703) are performed to thereby form a resist pattern, and etching (1704) is performed with the resist pattern, whereby a circuit pattern is formed.

In the present embodiment, an SEM image of the resist pattern formed after development (1703) or an SEM image of the circuit pattern formed after etching (1704) is obtained (1710). Then, a respective monitor item is selected (1711). In this event, the monitor item desired by a user is selected by the user. Then, a per-unit item calculation process is executed to calculate an image feature amount in units of the selected monitor item in accordance with the obtained SEM image (1712). Then, a respective estimate value is calculated (1714) for respective one of all or some of monitor items for the target evaluation pattern (unless otherwise specifically mentioned, description herebelow will be based on "at least one of the monitor items"). The calculation is performed by a per-unit item estimation engine 1713 by using the calculated image feature amount and learning data (learning data representing correlations between the monitor items and the image feature amounts) preliminarily registered or stored in a database 1715. Then, it is determined whether the calculation result satisfies a desired or predetermined specification (1716). If the result satisfies the specification, then the process proceeds to next step (1717). Alternatively, if the calculation result does not satisfy the specification, the operation selects a step of providing feedback (1718). In the event of providing feedback to the step of etching (1704), an etching condition adjustment amount is calculated (1720) and is then fed back to the step of etching (1704). In the event of providing feedback to the step of exposure (1702), an exposure condition adjustment amount is calculated (1719) and is then fed back to the step of exposure (1702). Process monitoring is performed in the manner described above.

The process monitoring method described above is an example of a management method, in which an estimate value of at least one of the monitor items of a target evaluation pattern is calculated from an SEM image of the target evaluation pattern, and a resist pattern, formed in the exposure process, or an etching pattern, formed in the etching process, is managed by using the result of the calculation. The configuration thus formed enables process monitoring of the respective monitor item, which cannot be implemented merely by the conventional pattern linewidth management.

Figure 16A:
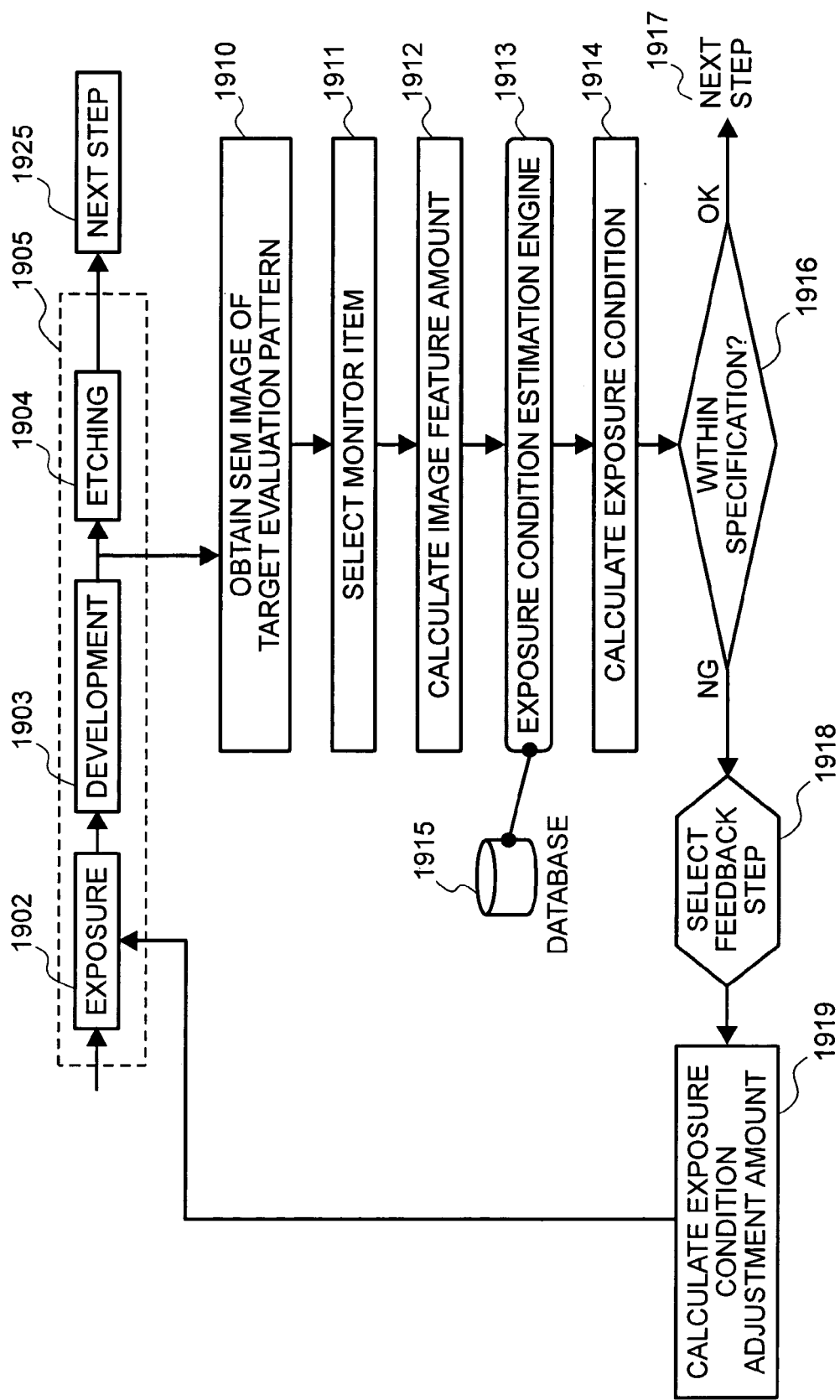
FIG. 16A is a diagram showing a processing flow for monitoring an exposure step with exposure conditions being used as a monitor item.

EXAMPLE (1) of Semiconductor Device Production Process Monitoring Method: Exposure Process Parameter Monitoring Method With reference to FIG. 16A, the following describes an embodiment in the case that, in the semiconductor device production process monitoring method according to the present invention, the processing step to be monitored is the step of exposure, and the monitor items are exposure conditions.

In the present embodiment, an SEM image of the resist pattern formed after development (1903) is obtained (1910). Then, an exposure condition is selected as a monitor item (1911). Then, a calculation process is executed to calculate an image feature amount in accordance with the obtained SEM image (1912). Then, an exposure condition is calculated (1914) for the target evaluation pattern. The calculation is performed by an exposure condition estimation engine 1913 by using the calculated image feature amount and learning data (learning data representing correlations between exposure conditions and image feature amounts) preliminarily registered or stored in a database 1915.

Then, it is determined whether the calculation result satisfies a desired or predetermined specification (1916). If the result satisfies the specification, then the process proceeds to next step (1917). Alternatively, if the calculation result does not satisfy the specification, then the process selects a step of providing feedback (1918) to a step of exposure (1902), calculates an exposure condition adjustment amount (1919), and provides the feedback of the adjustment amount to the step of exposure (1902). In the manner described above, the exposure condition of the target evaluation pattern is calculated from the SEM image of the target evaluation pattern, and the calculation result is used for the management, thereby making it possible to manage forming of the resist pattern in the exposure process. The method is an example of the process monitoring method according to the present invention. The example method has a feature that, in the configuration described above, manages the cross-sectional shape of the target evaluation pattern, process conditions, or device characteristics in, for example, the step of exposure or etching.

Figure 16B:
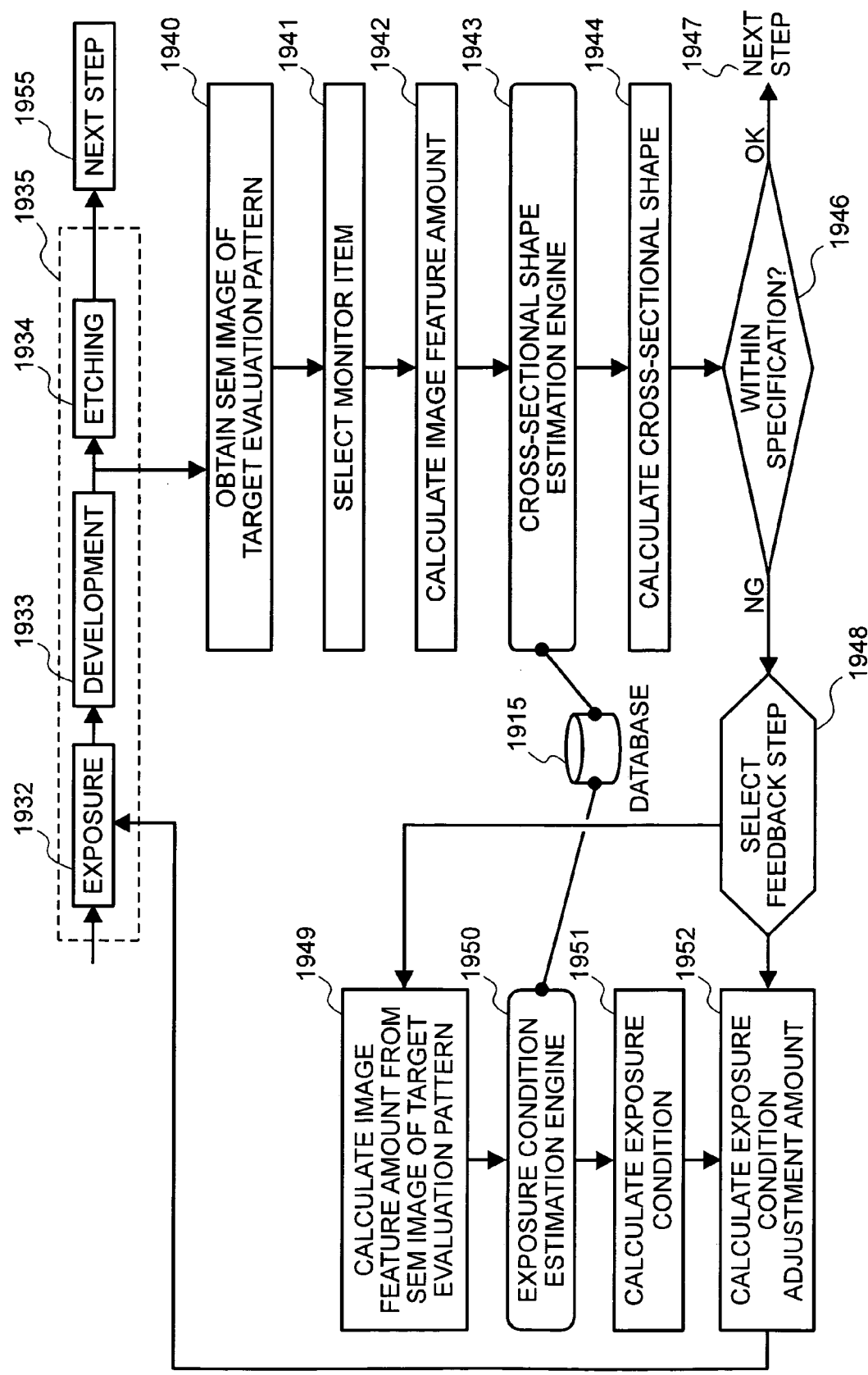
FIG. 16B is a diagram showing a processing flow for monitoring an exposure step with cross-sectional shapes being used as a monitor item.

EXAMPLE (2) of Semiconductor Device Production Process Monitoring Method: Exposure Process Parameter Monitoring Method With reference to FIG. 16B, the following describes an embodiment in the case that, in the semiconductor device production process monitoring method according to the present invention, the processing step to be monitored is the step of exposure, and the monitor item is the cross-sectional shape of the target evaluation pattern.

In the present embodiment, an SEM image of the resist pattern formed after development (1933) is obtained (1940). Then, a cross-sectional shape is selected as a monitor item (1941). Then, a calculation process is executed to calculate an image feature amount in accordance with the obtained SEM image (1942). Then, a cross-sectional shape is calculated (1944) for the target evaluation pattern. The calculation is performed by a cross-sectional shape estimation engine 1943 by using the calculated image feature amount and learning data (learning data representing correlations between cross-sectional shapes and image feature amounts) preliminarily registered or stored in a database 1945.

Subsequently, it is determined whether the calculation result satisfies a desired or predetermined specification (1946). If the result satisfies the specification, then process proceeds to next step (1947). Alternatively, if the calculation result does not satisfy the specification, the process selects a step of providing feedback (1948) to a step of exposure (1932), and calculates an image feature amount from the SEM image for use in estimation of an exposure condition (1949). Then, the exposure condition is estimated (1951) by an exposure condition estimation engine 1950 by using the calculated image feature amount and learning data (learning data representing correlations between exposure conditions and image feature amounts) preliminarily registered or stored in a database 1945.

In the manner described above, the exposure condition of the target evaluation pattern is calculated from the SEM image of the target evaluation pattern, and when the cross-sectional shape is defective, feedback is provided to the step of exposure, thereby making it possible to manage forming of the resist pattern in the exposure process. The method is an example of the process monitoring method according to the present invention. The example method has a feature that manages the cross-sectional shape of the target evaluation pattern, process conditions, or device characteristics in, for example, the step of exposure or etching in the configuration described above.

(Processing Flow for Calculation of Cross-sectional Shape)

Figure 15A:
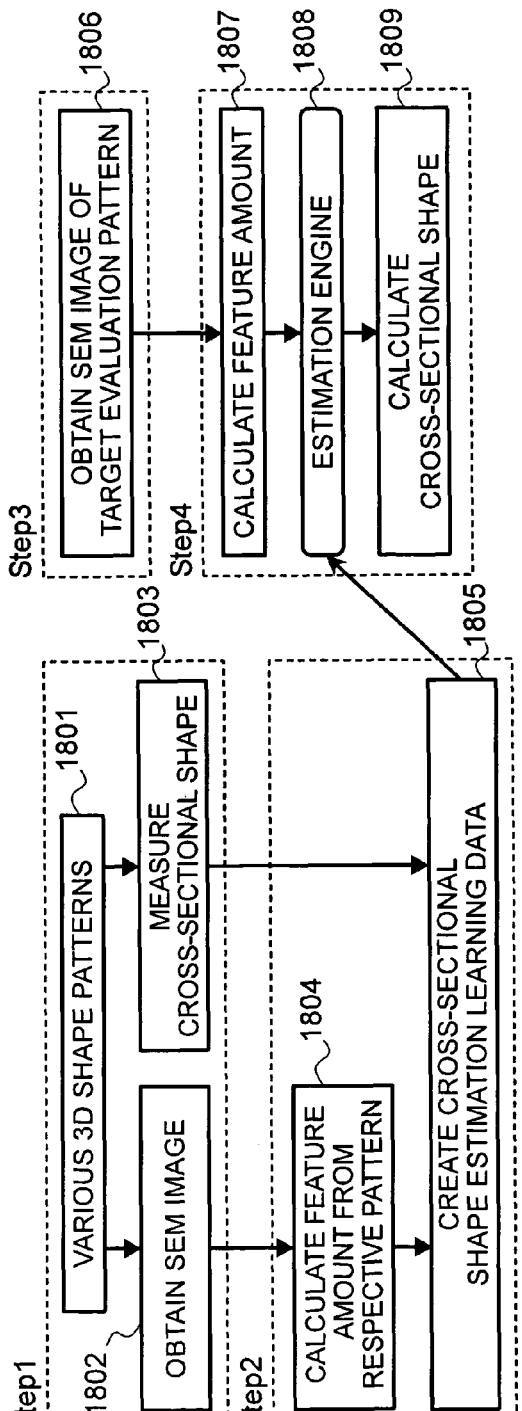
FIG. 15A is a diagram showing a processing flow for calculating process conditions for a cross-sectional shape of a target evaluation pattern from SEM images.

One example of a processing flow of a method of calculating cross-sectional shapes of target evaluation patterns from SEM images in accordance with the present invention will be described herebelow with reference to FIG. 15A.

This method broadly includes four steps. In steps 1 and 2, learning data for estimation of cross-sectional shapes (learning data representing correlations between cross-sectional shapes and image feature amounts) is created; and in steps 3 and 4, the cross-sectional shapes of the target evaluation patterns are estimated from the SEM images of the target evaluation patterns. The respective steps will be described herebelow.

SEM images of cross-sectional shape patterns (1801) of various shapes preliminarily formed under, for example, various process conditions are obtained (1802) (step 1). Concurrently, the cross-sectional shapes of the patterns are measured by an AFM (atomic force microscope) measurement, general-purpose SEM cross-section measurement, or another cross-section measurement means (1803) (step 1). Subsequently, image feature amounts, which will be described further below, are calculated in accordance with the obtained SEM images (1804), and learning data representing correlations between the calculated image feature amounts and the cross-sectional shapes is created (1805) (step 2). The created learning data hereinbelow is referred to as "cross-sectional shape estimation learning data."

Then, a respective SEM image of the target evaluation pattern is obtained (1806) (step 3). An image feature amount is calculated from the obtained SEM image of the target evaluation pattern (1807), and a cross-sectional shape of the respective target evaluation pattern is calculated by an estimation engine (1808), described further below, by using the calculated image feature amount and cross-sectional shape estimation learning data (1809) created in step 2 (step 4).

Subsequently, an SEM image of the target evaluation pattern is obtained (1806) (step 3). Then, an image feature amount is calculated from the obtained SEM image of the target evaluation pattern (1807). Then, by-using the image feature amount calculated as above and the cross-sectional shape estimation learning data created in step 2, a cross-sectional shape of the target evaluation pattern is calculated (1809) (step 4).

Figure 11:
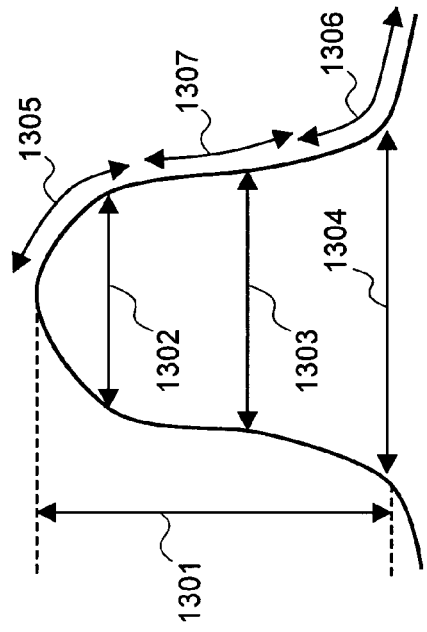
FIG. 11 is an explanatory view of a cross-sectional shape of a target evaluation pattern calculated in the present invention.

FIG. 11 shows examples of cross-sectional shapes (or, dimensions) to be measured in step 1. The cross-sectional shape to be measured is any one of, for example, a pattern height 1301, a top CD 1302 corresponding to line width information, a middle CD 1303, a bottom CD 1304, a corner-rounding shape 1305, a skirt-trailed shape 1306, and a pattern sidewall shape 1307.

Figure 1B:
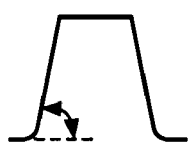
FIG. 1B shows a cross-sectional shape of an ordinary-taper pattern in which the tilt angle of the pattern sidewall is less than 90 degrees.
Figure 1C:
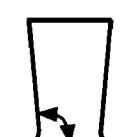
FIG. 1C shows a cross-sectional shape of a backward-taper pattern in which the tilt angle of the pattern sidewall is greater than 90 degrees.
Figure 1D:
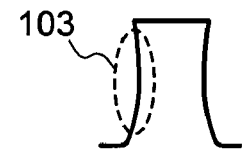
FIG. 1D shows a cross-sectional shape of a bowing-shaped pattern in which a pattern central portion is narrow, and the pattern sidewall is bowed inward.
Figure 1E:
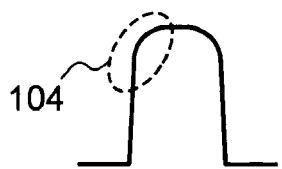
FIG. 1E shows a cross-sectional shape a pattern of which corner shapes in the pattern upper portion are rounded.
Figure 1F:
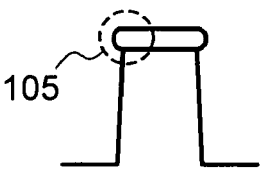
FIG. 1F shows a cross-sectional shape of an overhang-shaped pattern in which the corner portions overhang.
Figure 1G:
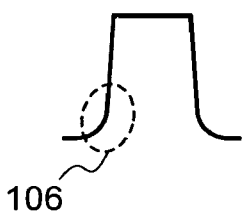
FIG. 1G shows a cross-sectional shape of a pattern having a shape in which feet in a pattern bottom portion are trailed such as to form a skirt.
Figure 1H:
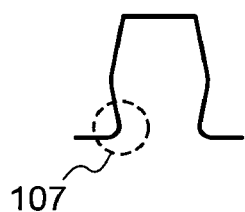
FIG. 1H shows a cross-sectional shape of a pattern having a shape in which sidewall portions coming to cross with a lower-base face in the pattern lower portion are bent inwardly of the sidewalls in the pattern upper portion.
Figure 1I:
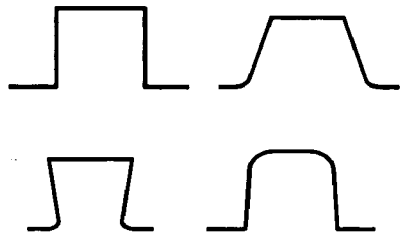
FIG. 1I shows patterns having a "film-reduced" shape in which the pattern height is less than a desired pattern height.
Figure 1J:
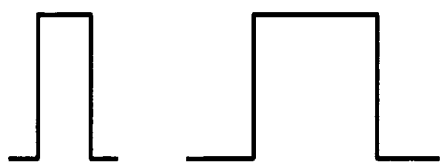
FIG. 1J shows two patterns, one having a pattern width is greater than a desired pattern width, and the other having a pattern width less than the desired pattern width.

In step 4, the respective cross-sectional shape to be calculated is for example, any one of those shown in FIG. 11, i.e., the pattern height 1301, the top CD 1302 corresponding to line width information, the middle CD 1303, the bottom CD 1304, a corner-rounding shape 1305, the skirt-trailed shape 1306, and the pattern sidewall shape 1307. In the present case, the method is capable of measuring respective one of various cross-sectional shapes of patterns having various shapes formed in the semiconductor production process, such as representative examples shown in FIGS. 1A to 1J, i.e., the normal pattern (FIG. 1A), ordinary taper pattern (FIG. 1B), reverse taper pattern (FIG. 1C), bowing pattern (FIG. 1D), top-rounding pattern (FIG. 1E), overhang pattern (FIG. 1F), skirt-trailed pattern (FIG. 1G), notch pattern (FIG. 1H).

For step 1, description has been made regarding the method of measuring various cross-sectional shape patterns actually formed under, for example, various process conditions. However, other methods are available, such as a method in which simulations are used to calculate measurement data of various cross-sectional shape patterns. More specifically, various cross-sectional shape patterns are calculated from litho-simulations, and SEM image to be subsequently formed are calculated from electron beam simulations. The SEM image obtained (imaged) through the electron beam simulation is used as the result of capture of the SEM image (1802) ("SEM imaging," hereafter), and the pattern cross-sectional shape obtained through litho-simulation is used as the result of the cross sectional shape measurement (1803). Creation of the estimation learning data from the simulation results eliminates the necessity of preliminarily actual creation of various cross-sectional shape patterns, thereby to making it possible to effectively create the learning data.

(Processing Flow for Calculation of Process Conditions)

Figure 15B:
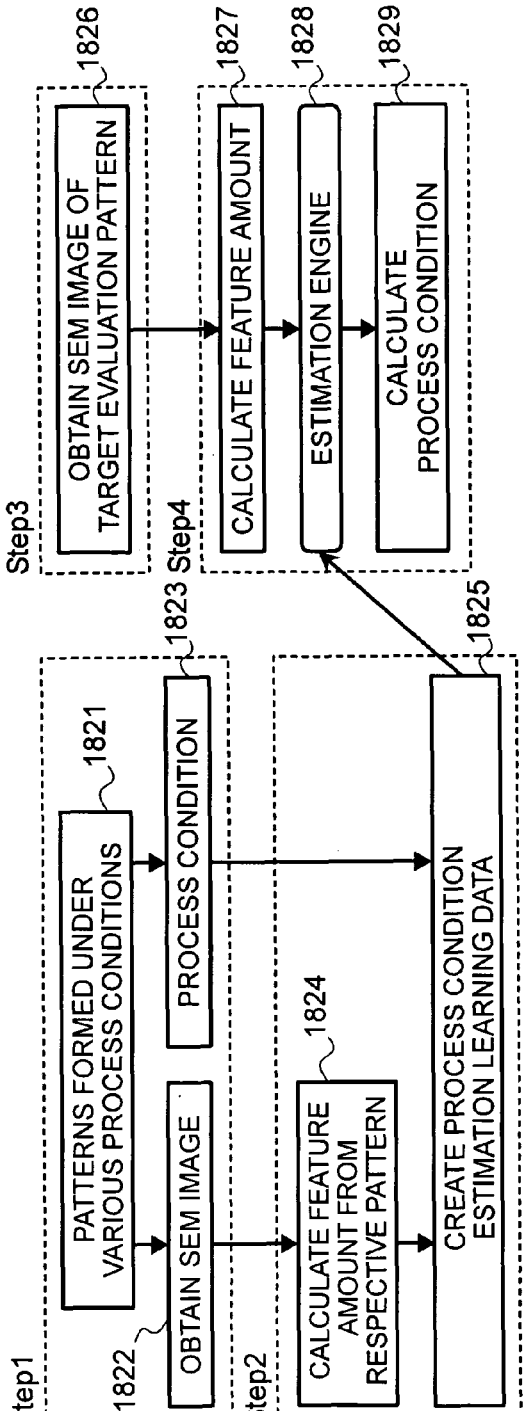
FIG. 15B is a diagram showing a processing flow for calculating process conditions for a cross-sectional shape of a target evaluation pattern from SEM images.

One example of a processing flow a method for calculating process conditions for cross-sectional shapes of target evaluation patterns from SEM images in accordance with the present invention will be described herebelow with reference to FIG. 15B.

This method broadly includes four steps. In steps 1 and 2, learning data for estimation of process conditions (learning data representing correlations between process conditions and image feature amounts) is created; and in steps 3 and 4, the cross-sectional shapes of the target evaluation patterns are estimated from the SEM images of the target evaluation patterns. The respective steps will be described herebelow.

SEM images of cross-sectional shape patterns (1821) of various shapes preliminarily formed under, for example, various process conditions are obtained (1822) (step 1). Subsequently, image feature amounts, which will be described further below, are calculated in accordance with the obtained SEM images (1824), and learning data representing correlations between the calculated image feature amounts and the cross-sectional shapes is created (1825) (step 2). The created learning data hereinbelow is referred to as "process condition estimation learning data."

Then, a respective SEM image of the target evaluation pattern is obtained (1826) (step 3). An image feature amount is calculated from the obtained SEM image of the target evaluation pattern (1827), and a cross-sectional shape of the respective target evaluation pattern is calculated by an estimation engine (1828), described further below, by using the calculated image feature amount and cross-sectional shape estimation learning data (1829) (step 4).

For step 1, description has been made regarding the method of measuring various cross-sectional shape patterns actually formed under the various process conditions. However, other methods are available, such as a method in which simulations are used to calculate measurement data of various cross-sectional shape patterns. More specifically, various cross-sectional shape patterns are calculated from litho-simulations, and SEM image to be subsequently formed are calculated from electron beam simulations. The SEM image obtained (imaged) through the electron beam simulation is used as the result of the SEM imaging (1822), and process condition estimation learning data is created by including the process conditions (1823) applied in the litho-simulation (1825). Creation of the estimation learning data from the simulation results eliminates the necessity of preliminarily actual creation of various cross-sectional shape patterns, thereby to making it possible to effectively create the learning data.

(Processing Flow for Calculation of Device Characteristics)

Figure 15C:
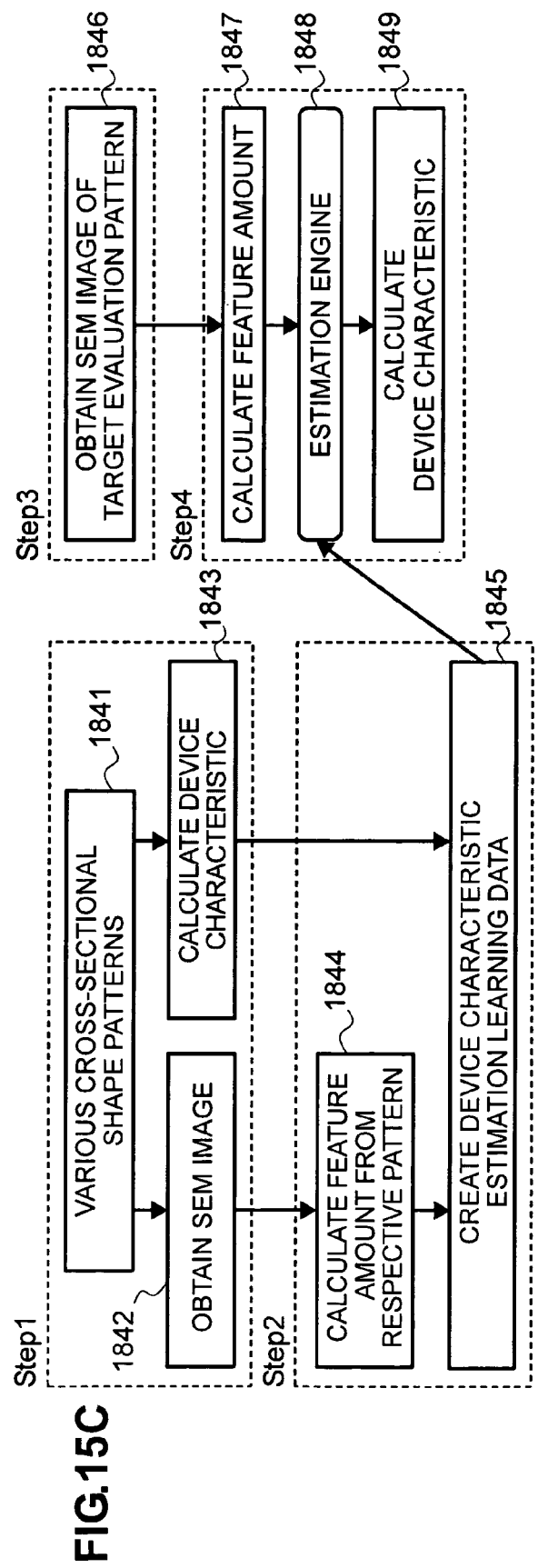
FIG. 15C is a diagram showing a processing flow for calculating device characteristics for a cross-sectional shape of a target evaluation pattern from SEM images.

One example of a processing flow a method for calculating device characteristics for cross-sectional shapes of target evaluation patterns from SEM images in accordance with the present invention will be described herebelow with reference to FIG. 15C. Similarly as the cross-sectional shape calculation method, the method broadly includes four steps. In steps 1 and 2, learning data for calculation of device characteristics is created; and in steps 3 and 4, the device characteristics of a circuit formed of the target evaluation patterns are estimated. The respective steps will be described herebelow.

SEM images of cross-sectional shape patterns (1841) of various shapes preliminarily formed under, for example, various device characteristics are obtained (1842) (step 1). Concurrently, device characteristics of the circuit formed of the target evaluation patterns are measured (1843) (step 1). A device characteristics measurement method will be described below. Subsequently, image feature amounts, which will be described further below, are calculated in accordance with the obtained SEM images (1844). Then, learning data representing correlations between the calculated image feature amounts and the device characteristics of the circuit to be formed of the target evaluation patterns are created (1845) (step 2). The created learning data hereinbelow is referred to as "device characteristics estimation learning data."

On the other hand, a respective SEM image of the target evaluation pattern is obtained (1846) (step 3). An image feature amount is calculated from the obtained SEM image of the target evaluation pattern (1847), and device characteristics of the respective target evaluation pattern is calculated by an estimation engine (1848), described further below, by using the calculated image feature amount and cross-sectional shape estimation learning data (1849) (step 4). As device characteristics of the circuits formed of the target evaluation patterns, characteristic items, such as a threshold voltage, drain current, leakage current, delay time, and operational speed, are measured by probe estimation and the like on the device created using the SEM-measured patterns.

(Calculation of Image Feature Amount for Estimation)

Image Feature Amount

Figure 5A:
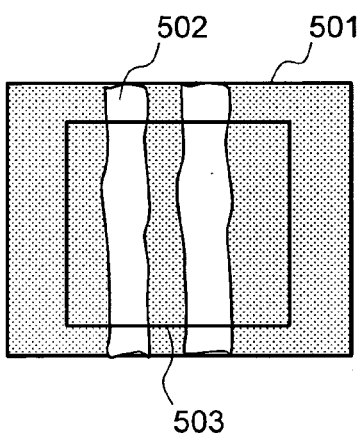
FIG. 5A shows an image feature amount calculation range on an SEM image of a target evaluation pattern.
Figure 5B:
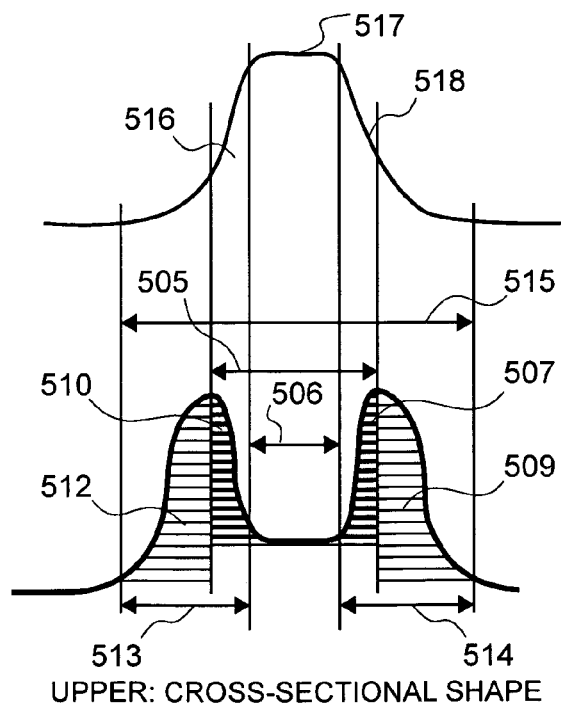
FIG. 5B shows a cross-sectional shape of a feature amount extraction range (upper portion), a line profile (lower portion), and a cross-sectional shape of a signal-intensity frequency distribution.

A description will be made hereinbelow regarding one example of a method of calculating the respective image feature amount (409), which is used to obtain the pattern cross-sectional shape, process conditions, or device characteristics form the SEM image of the target evaluation pattern in the apparatus 406 shown in FIG. 4. FIGS. 5A to 5B are explanatory views of an example of the method of calculating the image feature amount from the respective SEM image of the target evaluation pattern in the practice of the present invention.

In a process described below, an image feature amount calculation range 503 is extracted from an SEM image 501 of a target evaluation pattern shown in FIG. 5A, a line profile 504 shown in FIG. 5B is created, and various image feature amounts effective for calculation of cross-sectional shapes from the created line profile.

A detailed procedure of the process will be described hereinbelow. First, as shown in FIG. 5A, the image feature amount calculation range 503 necessary for creation of the line profile is specified from the SEM image 501. A target evaluation pattern 502 is assumed to be, for example, a line pattern extending in the y direction (vertical direction in the drawing) within a view field of the SEM image. In terms of the x direction (rightward-leftward direction in the drawing), the image feature amount calculation range 503 is a range inclusive of all portions where at least image feature amounts are calculated. In terms of the y direction, the image feature amount calculation range 503 is a range of the number of pixels (the number of scan lines) necessary for the process of averaging pixel values on the respective x coordinates in the y direction. For example, on the SEM image 501 shown in FIG. 5A, when the line pattern 502 extending along the y direction is a target evaluation pattern, an image range of a plurality of pixels (100 pixels, for example) is selected. In this event, if the number of pixels to be used for averaging the pixel values is large, noise components specific to the SEM image can be reduced. A selection range for the y direction is appropriately alterable depending on the shape of the target evaluation pattern.

Subsequently, for the selected image range, the process is performed to average pixel values (signal intensity values) on the respective x coordinates along the y direction, thereby creating (calculating) a line profile along the x direction. That is, a line profile 504 in the image feature amount calculation range 503 of the target evaluation pattern is created by the process described above. Then, in accordance with the calculated line profile 504, calculation is performed to obtain image feature amounts corresponding to various items of dimension information, such as line width, edge portion width, and the like of the target evaluation pattern, for example. The lower figure of FIG. 5B illustrates the relationship between a cross-sectional shape 516 of the target evaluation pattern and a line profile 504. In this case, the line profile 504 represents a secondary electron intensity obtained through the SEM. Generally, the secondary electron intensity increases corresponding to the tilt angle of the measurement target, such that the signal intensity in a sidewall portion 518 of the target evaluation pattern increases than that in a planar portion 517. A portion where the secondary electron intensity is thus increases in, for example, the sidewall portion of the line pattern, and is superimposed on the SEM image is referred to as a "white band." As image feature amounts representing variations in the cross-sectional shape of the target evaluation pattern, various image feature amounts as shown in the lower part of FIG. 5B are calculated.

A bottom width 515 of the pattern represents a tendency of the width at a footing of the line pattern cross-sectional shape. A top width 506 of the pattern incorporates the width at the top of the line pattern cross-sectional shape. A peak width 505 of the line profile represents a tendency of the width in a halfway portion of the line pattern cross-sectional shape, an average width 510 on the inner side of the lefthand white band represents a round in the lefthand top portion of the line pattern cross-sectional shape. An average width 507 on the inner side of the righthand white band represents the shape of the righthand top portion of the line pattern cross-sectional shape. An average width 512 on the outer side of the righthand white band represents the shape of the righthand footing portion of the line pattern cross-sectional shape. An average width 509 on the outer side of the lefthand white band represents the shape of the lefthand footing portion of the line pattern cross-sectional shape. A righthand white band width 513 represents a tendency of the width of the righthand sidewall side portion of the line pattern cross-sectional shape. A lefthand white band width 514 represents a tendency of the width of the lefthand sidewall side portion of the line pattern cross-sectional shape.

The nine image feature amounts described above are examples of image feature amounts useful for the cross-sectional shape calculation. The respective image feature amount representing the tendency of the target evaluation pattern (the image feature amount, hereinbelow, will be referred to as a "line width feature amount") serves as a feature amount useful for the calculation of the cross-sectional shape of the target evaluation pattern described with reference to FIG. 15A. From the fact that the process condition variation appears in the variation in the cross-sectional shape of a formation pattern, the variation in the cross-sectional shape of the formation pattern is represented by the line width feature amount, thereby making it possible to represent the tendency of the process condition. Consequently, the respective line width feature amount serves as a useful feature amount for calculation of the process conditions of the target evaluation pattern described with reference to FIG. 15B. Further, from the fact that even the device performance of the formation pattern is significantly influenced by the cross-sectional shape of the pattern, the line width feature amount is used, whereby the device performance can be estimated by the method described with reference to FIG. 15C.

Tilt Image Feature Amount

In the case of the respective feature (amount) calculated by using the line profile calculated from the SEM image, only the top-down image of the target evaluation pattern is used to represent the cross-sectional shape of the target evaluation pattern. As such, there can be a case where, for example, the sidewall shape, height (information), and footing shape of the line pattern cannot be sufficiently observed to satisfaction depending on the pattern shape. The following describes a method of calculation of an image feature amount that represents the cross-sectional shape of the pattern even in a situation as described above. The method uses the tilt SEM image described above in conjunction with the description of the metrological SEM.

FIG. 21A depicts examples of a top-down SEM image 2902 and tilt SEM image 2903 of a normally formed line pattern 2901. In the event that the normally formed line pattern 2901 has an ideal bilateral symmetric shape, the width of the white band in the righthand sidewall side portion and the width of the white band in the lefthand sidewall side portion are substantially the same in the top-down SEM image 2902 (strictly, however, the widths are different depending on the scan direction of the irradiating electron gun or the charged state of the measurement target). However, depending on the tilt direction, in the tilt SEM image 2903 of the same normally formed line pattern 2901, for example, while the white band in the righthand sidewall side portion is relatively wide, the white band in the lefthand sidewall side portion is relatively narrow.

Reasons for occurrence of the tendency as described above will be briefly described herein with reference to FIG. 21C. As described above in conjunction with the configuration of the metrological SEM, the plurality of methods are available for forming tilt SEM images. In the present case, however, it is assumed that, for the sake of brevity, the target evaluation pattern 2936 is tilted, and SEM electron (beam) is irradiated from the upper portion of the pattern (2919). In this event, since the pattern 2936 (line pattern) has the tilt, the electron beam is irradiated onto a relatively large region of the line pattern 2936 in a righthand sidewall side portion 2918. As such, a white band 2934 on the righthand sidewall side attributed to a righthand sidewall side portion 2918 is wide in comparison to the white band in the top-down SEM image. On the other hand, in a lefthand sidewall side portion 2917 of the line pattern 2936, the region irradiated with the electron beam is small, such that a white band 2933 on the lefthand sidewall side is narrow in comparison to the white band in the top-down SEM image.

As described above, with the target evaluation pattern being tilted, an observation region of the sidewall portion of the line pattern can be enlarged (the side of the righthand sidewall portion of the line pattern 2936 in the example shown in FIG. 21C), the sidewall portion thereof can be observed in detail in comparison to the top-down SEM image. Since the image feature amount similar to the line width feature amount shown in FIG. 5B is obtained from the line profile obtained from the tilt SEM image, the image feature amount representing the cross-sectional shape obtained in accordance with the tilt SEM image can be calculated.

The image feature amount described above is an example of an image feature amount useful for calculation of the cross-sectional shape of the target evaluation pattern calculated from the line profile 2920 in accordance with the tilt SEM image by using a tilt measurement function of the metrological SEM. The image feature amount representing the tendency of the target evaluation pattern (the image feature amount, hereinbelow, will be referred to as a "line width feature amount") serves as a feature amount useful for the calculation of the cross-sectional shape of the target evaluation pattern described with reference to FIG. 15A. From the fact that the process condition variation appears in the variation in the cross-sectional shape of a formation pattern, the variation in the cross-sectional shape of the formation pattern is represented by the line width feature amount, thereby making it possible to represent the tendency of the process condition. Consequently, the respective line width feature amount serves as a useful feature amount for calculation of the process conditions of the target evaluation pattern described with reference to FIG. 15B. Further, from the fact that even the device performance of the formation pattern is significantly influenced by the cross-sectional shape of the pattern, the line width feature amount is used, whereby the device performance can be estimated by the method described with reference to FIG. 15C.

Differential Tilt Image Feature Amount

As described above, with use of the image feature amount representing the tilt line width ("tilt line width feature amount," hereafter), a better result of cross-sectional shape calculation is obtainable, compared to the case where only the line width feature amount of the top-down SEM image is used. In addition, a method is available in which a variation amount in the image feature amount calculated by varying the tilt angle is used as an image feature amount representing the cross-sectional shape of the target evaluation pattern (which image feature amount hereinbelow will be referred to as a "differential tilt line width feature amount"). In the present case, one example in which the differential tilt line width feature amounts are useful for calculation of the cross-sectional shapes of patterns will be described with reference to FIGS. 21A and 21(B).

As shown therein, the cross-sectional shape of the target evaluation pattern is normal is represented by a pattern A (2901), and a case in which the pattern height is reduced or small is represented by a pattern B (2909). As described above, with reference to the line width feature amount and tilt line width feature amount of the pattern A, the tilt image is used, such that the white band in the righthand sidewall portion of the tilt line width feature amount is wider than in the case of the top-down SEM image. On the other hand, the white band in the lefthand sidewall portion is narrower than in the case of the top-down SEM image.

However, in the case of the a pattern, such as the pattern B, having the reduced pattern height, even with the tilt SEM image being used, the value of the white band in the righthand sidewall portion of the tilt line width feature amount is not varied relative to the case of the pattern A. Concurrently, also the value of the white band in the lefthand sidewall portion of the tilt line width feature amount is not varied relative to the case of the pattern A. This is attributed to the fact that since the height of the sidewall portion of the pattern B is reduced, even when the observation region of the sidewall portion of the target evaluation pattern is enlarged by using the tilt image, it does not work to enlarge the white band width.

Accordingly, the white band width of the differential tilt line width feature amount of the pattern A is larger in value than the white band width of the differential tilt line width feature amount of the pattern B. The differential tilt line width feature amount described herein is an example of an image feature amount useful for calculation of a three-dimensional (3D) shape of a target evaluation pattern obtained from a tilt image obtained by altering the tilt angle. The image feature amount representing the tendency of the target evaluation pattern (the image feature amount, hereinbelow, will be referred to as a "line width feature amount") serves as a feature amount useful for the calculation of the cross-sectional shape of the target evaluation pattern described with reference to FIG. 15A. From the fact that the process condition variation appears in the variation in the cross-sectional shape of a formation pattern, the variation in the cross-sectional shape of the formation pattern is represented by the line width feature amount, thereby making it possible to represent the tendency of the process condition. Consequently, the respective line width feature amount serves as a useful feature amount for calculation of the process conditions of the target evaluation pattern described with reference to FIG. 15B. Further, from the fact that even the device performance of the formation pattern is significantly influenced by the cross-sectional shape of the pattern, the line width feature amount is used, whereby the device performance can be estimated by the method described with reference to FIG. 15C.

Texture Information

One example of a calculation method for image feature amounts useful for calculation of cross-sectional shapes of target evaluation patterns from SEM images in accordance with the present invention will be described hereinbelow with reference to FIGS. 6A and 6B. An image feature amount described hereinbelow has a feature that calculates two-dimensional (2D) information included in an image region containing a target evaluation pattern, from an SEM image of the target evaluation pattern. More specifically, a description will be given of a calculation method for an image feature amount useful for a cross-sectional shape of a target evaluation pattern through analysis of a texture included in an image region containing a target evaluation pattern.

Figure 6A:
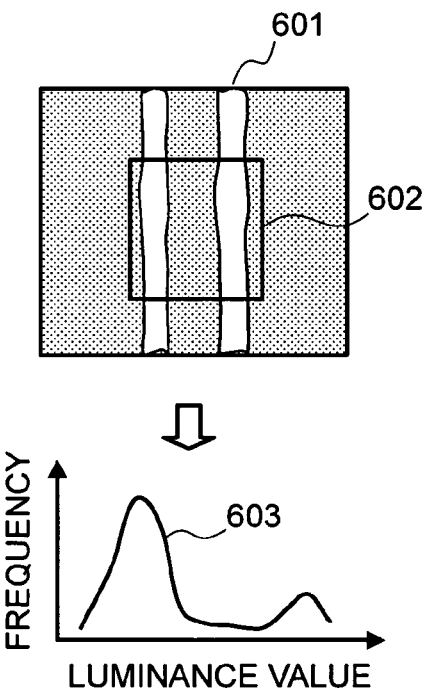
FIG. 6A shows a texture analysis region (upper portion) of a target evaluation pattern of an SEM image, and a signal-intensity frequency distribution (lower portion) within the texture analysis region.
Figure 6B:
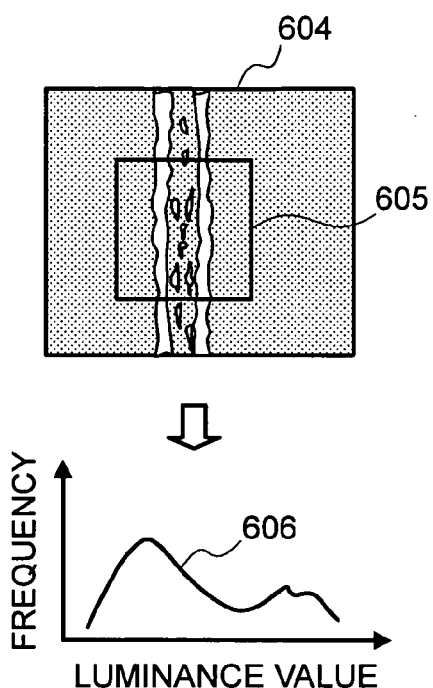
FIG. 6B shows a texture analysis region (upper portion) of a target evaluation pattern of an SEM image, and a signal-intensity frequency distribution (lower portion) within the texture analysis region when a top portion of a target evaluation pattern is formed in a wavy shape because of semiconductor process conditions.

Referring to FIGS. 6A and 6B, the image feature amount calculation method will now be described hereinbelow. In an SEM image 601, a texture analysis region 602 targeted for the texture analysis of the target evaluation pattern is specified. The texture analysis region 602 is specified so as to contain a target evaluation pattern. In the present example of the texture analysis method, a frequency distribution of the signal intensity is obtained from within the texture analysis region 602, an image feature amount representing the shape of a frequency distribution 603 is obtained, and the obtained image feature amount is used to the image feature amount of the target evaluation pattern. Image feature amounts representing shapes of frequency distributions indicative include those of, for example, an average, dispersion, skew, and kurtosis.

The respective image feature amounts are given by equations (1) below, where the frequency of a signal intensity i is represented by P(i).

Numeric expression 1
$$\text{Average } \mu = \sum_{i=0}^{n-1} iP(i),$$
$$\text{Dispersion } \sigma^2 = \sum_{i=0}^{n-1} (i-\mu)^2 P(i),$$
$$\text{Skew } S = \sum_{i=0}^{n-1} (i-\mu)^3 P(i)/\sigma^3,$$
$$\text{Kurtosis } K = \sum_{i=0}^{n-1} (i-\mu)^4 P(i)/\sigma^4$$

For example, it is assumed that the top portion of a target evaluation pattern is not planar, but is wavy. In this case, a texture image feature amount calculated from a frequency distribution 606 of the signal intensity within a texture analysis region 605 of an SEM image 604 is smaller relative to the SEM image 601 of the pattern having the planar top. With use of the texture feature amount shown in the present case, the tendency of the cross-sectional shape of the pattern can be captured. In the texture analysis described in the present case, the feature amount calculated from the frequency distribution of the SEM signal intensity is an example of an image feature amount for capturing a cross-sectional shape of a pattern. The image feature amount representing the tendency of the target evaluation pattern (the image feature amount, hereinbelow, will be referred to as a "line width feature amount") serves as a feature amount useful for the calculation of the cross-sectional shape of the target evaluation pattern described with reference to FIG. 15A.

In addition, from the fact that the process condition variation appears in the variation in the cross-sectional shape of a formation pattern, the variation in the cross-sectional shape of the formation pattern is represented by the line width feature amount, thereby making it possible to represent the tendency of the process condition. Consequently, the respective line width feature amount serves as a useful feature amount for calculation of the process conditions of the target evaluation pattern described with reference to FIG. 15B. Further, from the fact that even the device performance of the formation pattern is significantly influenced by the cross-sectional shape of the pattern, the line width feature amount is used, whereby the device performance can be estimated by the method described with reference to FIG. 15C.

Line Profile Analysis
(Notch Detection Image Feature Amount)

Figure 7A:
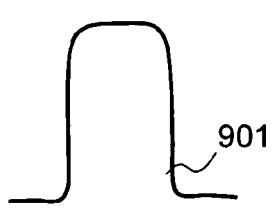
FIG. 7A shows a cross-sectional shape of a normal line pattern.
Figure 7B:
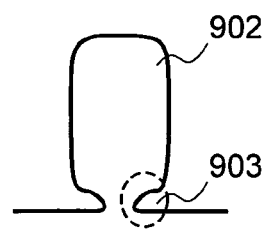
FIG. 7B shows an abnormal cross-sectional shape having a line pattern bottom portion bent inwardly of the line.
Figure 7C:
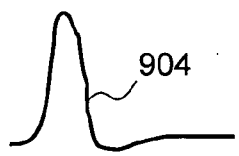
FIG. 7C shows a line profile corresponding to the pattern righthand sidewall portion of a normal line pattern.
Figure 7D:
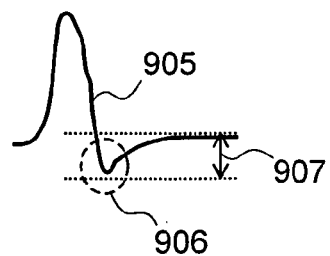
FIG. 7D shows a line profile corresponding to the pattern righthand sidewall portion of a normal line pattern.

FIGS. 7A to 7D are explanatory views of an example of a calculation method for image feature amounts in the practice of the present invention, which are useful for calculating cross-sectional shapes of patterns from SEM images of target evaluation patterns. In the event that a specific tendency occurs in the line profile obtained from the SEM image due to a cross-sectional shape of a target evaluation pattern, the tendency of the line profile is analyzed and calculated as an image feature amount. In the present case, by way of an example of the image feature amount, an image feature amount enabling the detection of a notch shape 903 of a resist pattern will be described with reference to FIGS. 7A to 7D. FIGS. 7A and 7B, respectively, show cross-sectional shapes of a line pattern. More specifically, FIG. 7A shows a cross-sectional shape of a normal line pattern 901; and FIG. 7B shows a line pattern 902 of an abnormal cross-sectional shape 903 having a line pattern bottom portion 903 bent inwardly of the line. Such a cross-sectional shape such as the abnormal cross-sectional shape 903 is referred to as a "notch."

The line profiles shown in FIGS. 7A and 7B (which respectively correspond to FIGS. 7D and 7C), which line profiles are obtained from the SEM images of the respective shapes of the patterns, are now compared with one another. A line profile in the righthand sidewall portion of the pattern corresponding to the abnormal cross-sectional shape (903) of FIG. 7B, namely, a line profile 905 of FIG. 7D, the signal intensity of a footing portion 906 of the mountain of the line profile tends to be lower in comparison to a line profile 904 of FIG. 7C, which corresponds to the righthand sidewall portion of the line profile 901 of FIG. 7A.

It is considered that such a tendency of the line profile is attributed to the charged state of the pattern associated with the cross-sectional shape of the target evaluation pattern and to the behavior of the secondary electron associated with charging thereof. In the present case, the tendency to reduction in the signal intensity of the footing portion 906 of the line profile is calculated as an image feature amount. In the calculation method for the image feature amount, a differential 907 between, for example, the SEM signal intensity in a base portion of an observation pattern and the signal intensity of the notch portion is calculated as an image feature amount.

The image feature amount, which is obtained through the analysis of the shape of the line profile obtained from the SEM image taken of the target evaluation pattern, is one of image feature amounts useful for calculation of cross-sectional shapes of target evaluation patterns. With use of image feature amounts representing line-profile shape variations caused due to various cross-sectional shapes of target evaluation patterns, good cross-sectional shape calculation results can be obtained in the calculation of cross-sectional shapes of target evaluation patterns, which is further described below. In addition, the calculated image feature amount can be used to represent the presence or absence of notch occurrence, or alternatively as an index value representing the degree of the notched state (degree of bending of the line bottom inwardly of the line pattern (903)).

Further, the image feature amount, which is obtained through the analysis of the line profile obtained from the top-down SEM image, is an image feature amount attributed to the behavior of the secondary electron associated with the charged state of the pattern in a peripheral portion of the notch portion and charging thereof. However, the image feature amount is not representative of the behavior of the secondary electron in the notch portion itself (i.e., emission of the secondary electron at the pattern edge of the notch portion (which hereinbelow will be referred to as "edge effects")).

Figure 9A:
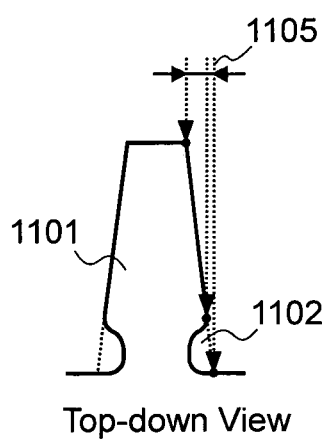
FIG. 9A shows the relationship between a pattern cross section and incident electron beams when a top-down image is observed.
Figure 9B:
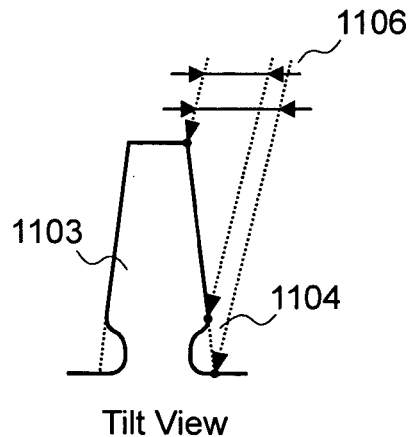
FIG. 9B shows the relationship between a pattern cross section and incident electron beams when a tilt image is observed.

As such, as shown in FIG. 9B, with use of the tilt SEM image described in conjunction with the description of the metrological SEM, electron 1106 of the SEM is directly irradiate on a notch portion 1104 in the line pattern bottom portion. Thereby, an SEM image from which edge effects in the notch portion is observed is obtained and a line profile thereof is analyzed, thereby enable the calculation of an image feature amount representing the degree of the notched state.

(Overhang Detection Image Feature Amount)

FIGS. 8A to 8F are explanatory views of an example of a calculation method for image feature amounts in accordance with the present invention, which image feature amount are useful for calculation of cross-sectional shapes of target evaluation patterns from SEM images of the target evaluation patterns. In the event that a specific tendency occurs in the line profile obtained from the SEM image due to a cross-sectional shape of a target evaluation pattern, the tendency of the line profile is analyzed and calculated as an image feature amount.

Figure 8A:
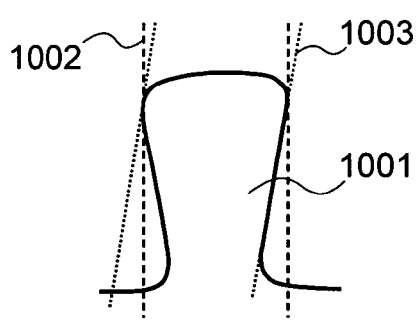
FIG. 8A shows a cross section of a pattern in which the sidewalls have a backward-taper overhung shape.
Figure 8B:
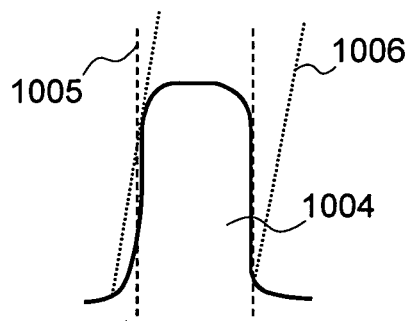
FIG. 8B shows a cross-sectional shape of a pattern having a normal shape.
Figure 8C:
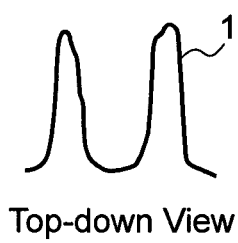
FIG. 8C shows a line profile calculated from a top-down SEM image of a pattern in which the cross section has an overhang shape.
Figure 8D:
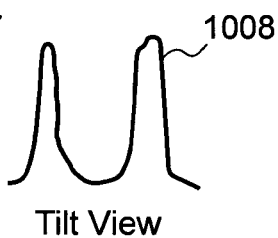
FIG. 8D shows a line profile calculated from a tilt SEM image of a pattern in which the cross section has an overhang shape.
Figure 8E:
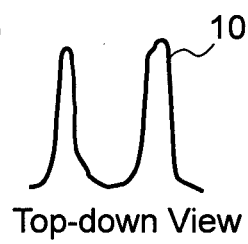
FIG. 8E shows a line profile calculated from a top-down SEM image of a pattern in which the cross section has a normal shape.
Figure 8F:
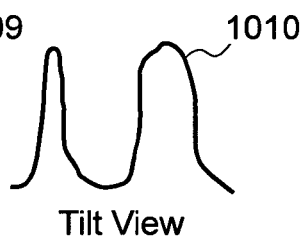
FIG. 8F shows a line profile calculated from a tilt SEM image of a pattern in which the cross section has an overhang shape.

FIG. 8A shows a shape 1001 in which the sidewalls of a cross sectional shape of a pattern form a backward taper, and the shape is referred to an "overhung" shape. FIG. 8B shows a cross-sectional shape 1004 of a pattern of a normal shape. FIGS. 8C to 8F, respectively, shows a line profile 1007 from a top-down SEM image of an overhang shape pattern, a line profile 1008 calculated from a tilt image, a line profile 1009 calculated from a top-down SEM image of a normal shape pattern, and a line profile 1010 calculated from a tilt image.

Substantially no difference exists between the line profiles 1007 and 1009. However, the respective line profiles 1008 and 1010 have the following different tendencies. In the line profile 1010 of the normal pattern 1004, as described above, any one of lefthand and righthand white bands tend to be wide (in FIG. 8B, the white band in the righthand sidewall portion is wide). However, in the overhung pattern 1001, because of the charged state and behavior of the secondary electron attributed to the pattern shape, the white band of the line profile 1008 has a tendency not to be wide within a range of to a certain degree of the tilt angle. An image feature amount representing such a difference in the line profiles of the normal pattern 1004 and the overhung pattern 1001 is calculated, and is used as an image feature amount for use in the calculation of cross-sectional shapes of target evaluation patterns.

For example, the above-described tilt line width feature amount is one of the image feature amounts that are calculated from line profiles. The image feature amount described in the present case, which is obtainable from the tilt SEM image taken of the target evaluation pattern, is one example of image feature amounts useful for calculation of cross-sectional shapes of target evaluation patterns having an overhung shape. With use of image feature amounts obtained from line profiles obtained from tilt SEM images caused due to various cross-sectional shapes of target evaluation patterns, good cross-sectional shape calculation results can be obtained in the calculation of cross-sectional shapes of target evaluation patterns, which is further described below.

(Selection of Estimation Engine)

A description will be made regarding selection of an estimation engine for estimation of monitor items (cross-sectional shapes of patterns, or process conditions, or some or all of device characteristics) in accordance with the present invention. For the estimation engine, an appropriate engine is determined in accordance with the correlation between a monitor item and image feature amount represented by learning data. While examples of estimation engines are described in the present case, the estimation engine is not limited to such examples, but other estimation engines are usable. In the present case, by way of examples of estimation engines, a likelihood estimation scheme, a method using a multiple-regression analysis, and an estimation method using a k-NN (nearest neighbor) scheme.

While the respective estimation engines have features described below, an appropriate estimation engine is selected corresponding to the correlation between the monitor item and the image feature amount, as described above. In the case that a distribution between the monitor items and image feature amounts has continuity without nonuniformity, a likelihood estimation scheme that carries out approximation by function formulas or a multiple-regression scheme is suitable for the distribution. The respective method has an advantage in that the since the approximation is performed, the influence of an exceptional value contained in learning data is less imposed.

However, the respective method has a disadvantage in that appropriate function formulas have to be set for approximation. On the other hand, in the case that the distribution described above has low continuity and nonuniformity, the k-NN scheme not performing approximation using function formulas is suitable for the distribution. This scheme does not carry out approximation by using function formulas, therefore offers the advantage of being useful in the case that approximation by using function formulas encounters a difficulty. On the other hand, however, the scheme has a disadvantage in that the influence of exceptional value of learning data is likely to be imposed. As such, taking account into such advantages and disadvantages, an appropriate engine is selected corresponding to the correlation between the monitor items and image feature amounts. Example monitor-item estimation methods using the respective estimation engines will be sequentially described below.

Likelihood Estimation

Figure 12:
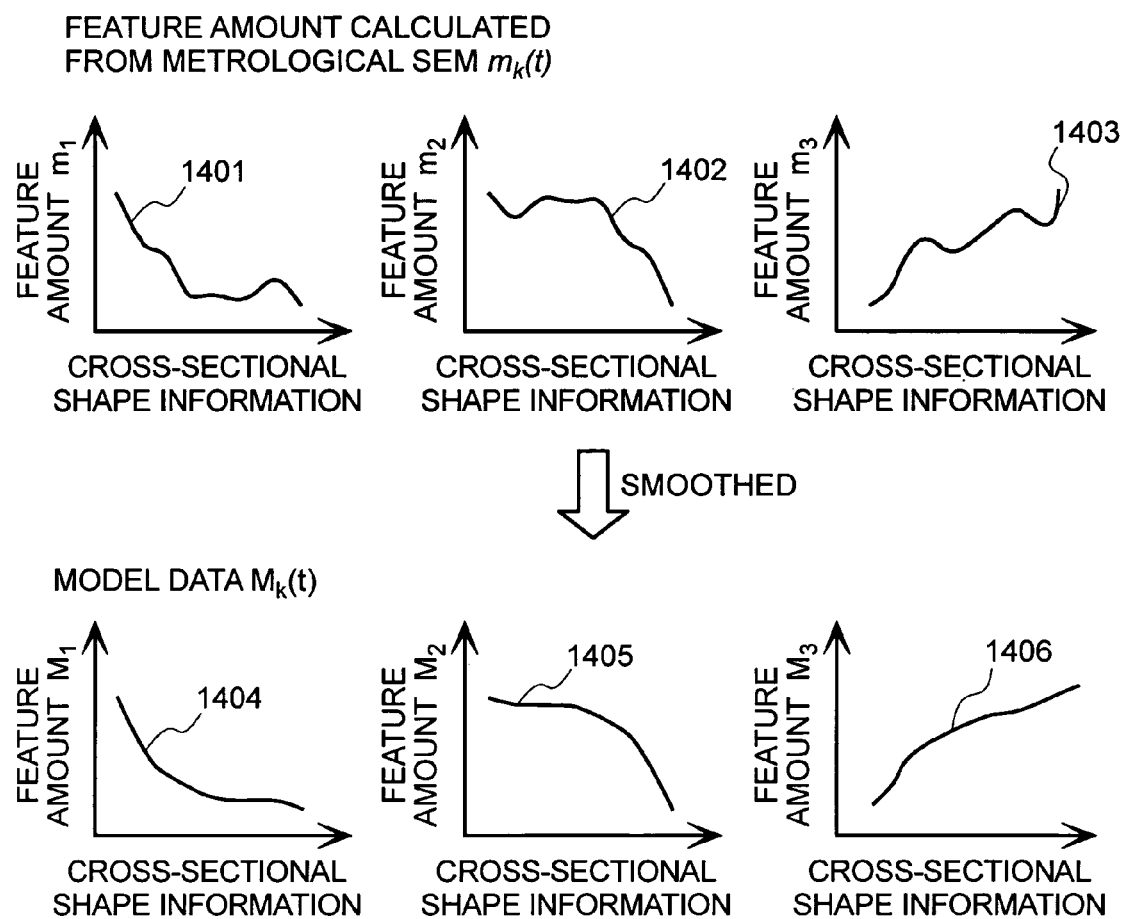
FIG. 12 shows diagrams showing feature amounts calculated from SEM images of patterns having various cross-sectional shapes, and also shows feature amounts calculated by smoothing the SEM images.

An example of the estimation method for cross-sectional shapes of patterns, or process conditions, or device characteristics will be described herebelow with reference to FIGS. 12 and 13A to 13C. The method described herebelow is a method using the above-described likelihood estimation scheme for the estimation engine. In the present case, as estimation targets, cross-sectional shapes are estimated. Estimation of process conditions can be performed in a similar method in which the cross-sectional shapes are replaced with the process conditions. While, in the present case, the estimation engine is the likelihood estimation scheme, the method is not specifically limited to the likelihood estimation scheme. However, any of other estimation engines can be used inasmuch as it is capable of estimating the cross-sectional shapes or process conditions in accordance with respective inputs of image feature amounts of the measurement (estimation) targets. FIG. 12 is a view showing a creating method for the cross-sectional shape estimation learning data discussed in conjunction with FIG. 10 (step 2). FIGS. 13A to 13C are views showing a method of calculating cross-sectional shapes of target evaluation patterns in the manner that respective image feature amounts calculated from target evaluation patterns shown in FIG. 10 (step 4) are compared to the cross-sectional shape estimation learning data. In the present case, only three image feature amounts are used for the cross-sectional shape estimation for the sake of brevity.

Figure 10:
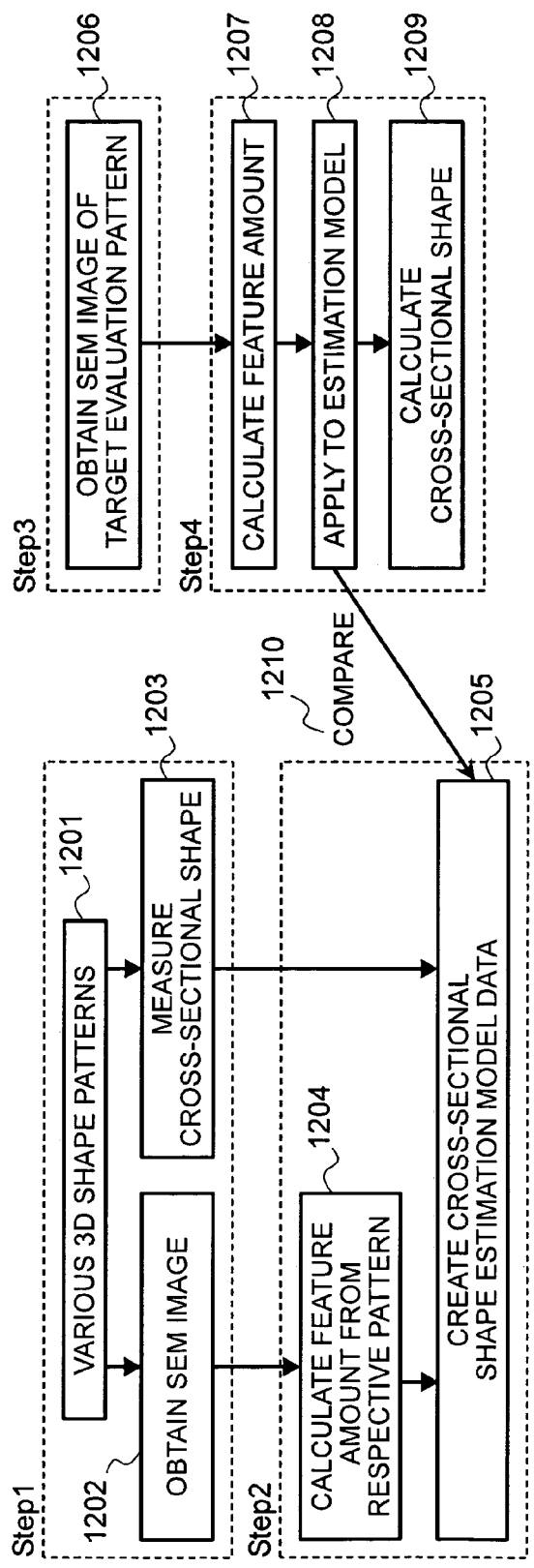
FIG. 10 is a view showing a flow of steps for calculating cross-sectional shapes.

In the step 1 of FIG. 10, SEM images of various cross-sectional shapes are obtained. In the step 2, an image feature amount is calculated from the SEM images obtained in the step 1, and the correlation between the image feature amount calculated in units of the image feature amount and an observation is obtained.

Graphs 1401 to 1403 in the upper potion of FIG. 12, respectively, show the correlation between the calculated image feature amounts and the observation-target cross-sectional shapes (pattern heights, for example), in which the respective horizontal axes represent the respective cross-sectional shapes and the respective vertical axes represent respective plotted image feature amounts $M_1$ to $M_3$. Then, as shown in graphs 1404 to 1406 in the lower portion of FIG. 12, the respective graphs 1401 to 1403 in the upper portion of FIG. 12 are smoothed to thereby create learning data correlating the respective image feature amounts $M_1$ to $M_3$ and the respective cross-sectional shapes.

The function representing the learning data is denoted by represented by Mk(i) (i=value representing the cross-sectional shape), and the learning data is created in units of one feature amount. The letter k (k=1, ..., n) denotes the respective image feature amount. The letter n denotes the number of image feature amounts. The calculated learning data is stored into a storage medium coupled to the arithmetic logic unit (computer).

In the above-described step 3, a respective SEM image of the target evaluation pattern is obtained. Then in step 4, a respective image feature amount is calculated from the SEM image obtained in step 3, and the calculated image feature amount is compared to the cross-sectional shape estimation learning data stored in the recording medium, thereby to estimate a 3D shape.

In FIGS. 13A to 13C, the respective image feature amount calculated from the SEM image of the target evaluation pattern is denoted by f1, f2, f3 for the value. As shown in FIG. 13A, the value of the image feature amount f1, f2, f3, respectively, are represented by a value 1504, 1505, 1506 on image data 1501, 1502, 1503.

It is assumed that, regarding the respective image feature amount f1, f2, f3, a fluctuation of an image feature amount fk follows a standard deviation uk, a likelihood function pk(i) (k=1, ..., n) as shown in equation (2) is obtained. The function pk(i) takes a value representing the probability that the cross-sectional shape (such as the pattern height, for example) is i.

$$p_k(i) = \frac{1}{\sqrt{2\pi}} \exp\left\{-\frac{(I_k - M_k(i))^2}{2\sigma_k}\right\}$$ Numeric expression 2

The variable σk is set to a value conforming to an actual condition of a process fluctuation of the image feature amount fk. Examples of the calculated likelihood functions, respectively, are shown in graphs 1507 to 1509 of FIG. 13B. In the respective image feature amount, as the likelihood increases, there is shown the cross-sectional shape proportionally closer to the cross-sectional shape of the target evaluation pattern. As shown in equation (3), the respective image feature amounts calculated from the respective image feature amounts are multiplied together, thereby to produce a value with which a cross-sectional shape 1510 having a highest value represents the cross-sectional shape of the target evaluation pattern (refer to equation (4)).

$$P(i) = p_1(i) \times p_2(i) \times \Lambda \times p_n(i)$$ Numeric expression 3

$$i = \{i \mid P(i) = \max_j P(j)\}$$ Numeric expression 4

The above-described method of calculating cross-sectional shapes of target evaluation patterns in accordance with the likelihood estimation is an example of the method of calculating a cross-sectional shape of a target evaluation pattern by using the image feature amounts calculated from the SEM images of the target evaluation patterns. As in the method, the estimation process is performed by using all or some of the some image feature amounts exemplified above, thereby making it possible to calculate the cross-sectional shape of the pattern, or process conditions, or device characteristics.

Multiple-Regression Equation

As an example of a method of estimating a cross-sectional shape of target evaluation patterns or process conditions in accordance with the present invention, shown is an estimation method using a multiple-regression equation for the cross-sectional shape estimation learning data in FIG. 10 (step 2, described above). Estimation of process conditions can be performed in a similar method in which the cross-sectional shapes are replaced with the process conditions. While, in the present case, the multiple-regression analysis (scheme) is used for the estimation engine, the method is not specifically limited to the multiple-regression analysis. However, any of other estimation engines can be used inasmuch as it is capable of estimating the cross-sectional shapes or process conditions in accordance with respective inputs of image feature amounts of the measurement (estimation) targets. More specifically, in the method, weights (regression variables) suitable for desired cross-sectional shape estimation are multiplied together, and the sum thereof is used to calculate the cross-sectional shape of the target evaluation pattern.

In the phase of creating the cross-sectional shape estimation learning data in FIG. 10 (step 2), the regression variable is calculated in accordance with the measurement results of patterns of variable cross-sectional shapes, and the obtained multiple regression is stored as cross-sectional shape estimation learning data into the storage medium coupled to the arithmetic logic unit (computer). As an example of the multiple-regression equation used in the present case is expressed by, for example, equation (5) below.

Numeric expression 5

$$\hat{y} = a + b_1 x_1 + b_2 x_2 + \ldots$$

In the above, $\hat{y}$ (objective variable) represents a cross-sectional shape (pattern height, for example) of a target evaluation pattern; $x_i$ (explanatory variable) represents an image feature amount (line width feature amount, for example) calculated from an SEM image of a target evaluation pattern; $b_i$ (regression variable) is represents a weight suitable for the cross-sectional shape estimation and is multiplied with the respective image feature amount; and a represents a constant term (i=1, ..., n; n=total number of image feature amounts).

In order to calculate cross-sectional shapes of target evaluation patterns, image feature amounts to be used in equation (5) are obtained from the SEM image of the target evaluation patterns, and the respective image feature amounts are set to the cross-sectional shape estimation learning data in the multiple-regression equation, thereby to calculate the cross-sectional shape of the target evaluation pattern. The above-described method using the multiple-regression equation for calculating the cross-sectional shape of the target evaluation pattern is an example of the method of calculating cross-sectional shapes of target evaluation patterns by using the image feature amounts calculated from the SEM images of the target evaluation patterns. As in the method, the estimation process is performed by using all or some of the some image feature amounts exemplified above, thereby making it possible to calculate cross-sectional shapes of patterns, or process conditions, or device characteristics.

(k-NN Scheme)

FIG. 24 is an explanatory view of a method of estimating the pattern height 1301, which is one of the cross-sectional shapes of the target evaluation patterns described in conjunction with FIG. 11, by using a nearest neighbor scheme for the estimation engine. The method is shown therein as an example of the method of estimating cross-sectional shapes of target evaluation patterns or process conditions in accordance with an embodiment of the present invention. Estimation of process conditions can be performed in a similar method in which the cross-sectional shapes are replaced with the process conditions. While, in the present case, the nearest neighbor scheme is used for the estimation engine, the method is not specifically limited to the nearest neighbor scheme. However, any of other estimation engines can be used inasmuch as it is capable of estimating the cross-sectional shapes or process conditions in accordance with respective inputs of image feature amounts of the measurement (estimation) targets.

Figure 24A:
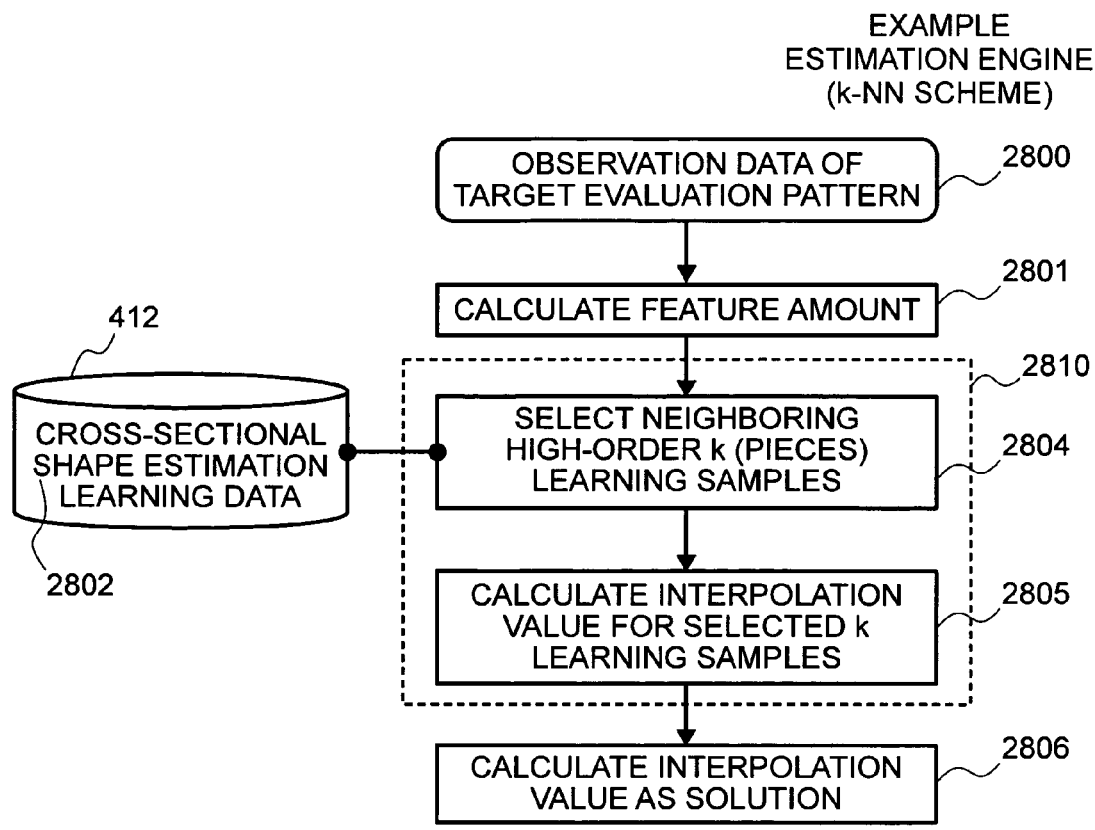
FIG. 24A is a diagram showing a processing flow of a method of estimating a cross-sectional shape by using a nearest neighbor scheme.

FIG. 24A is a diagram showing a processing flow of an estimation method using the oxygen feed method for estimating cross-sectional shapes of semiconductor patterns or process conditions. In the present method, as the cross-sectional shape estimation learning data in FIG. 10 (step 2), respective combinations of image feature amounts of SEM images of patterns having various cross-sectional shapes (an arbitrary sample of the learning data hereinbelow will be referred to as a "learning pattern") and the cross-sectional shapes are registered or stored as they are. As such, creation of the function representing the learning data such as performed in the likelihood estimation scheme is not performed. Then, an image feature amount (2801) of an SEM image of a target evaluation pattern is calculated (2800), and k (pieces) high-order learning samples near the target evaluation pattern in a feature amount space are selected (2804). For the height of the respective selected high-order k learning sample, an interpolation value in accordance with a displacement vector between the target evaluation pattern and the learning sample is calculated (2805), thereby to estimate the height of the target evaluation pattern (2806). In the present case, for k, an arbitrary value in the range from 1 to the total number of learning samples can be set, and the value is determined in accordance with the distribution state of the learning samples within the feature amount space.

Figure 24B:
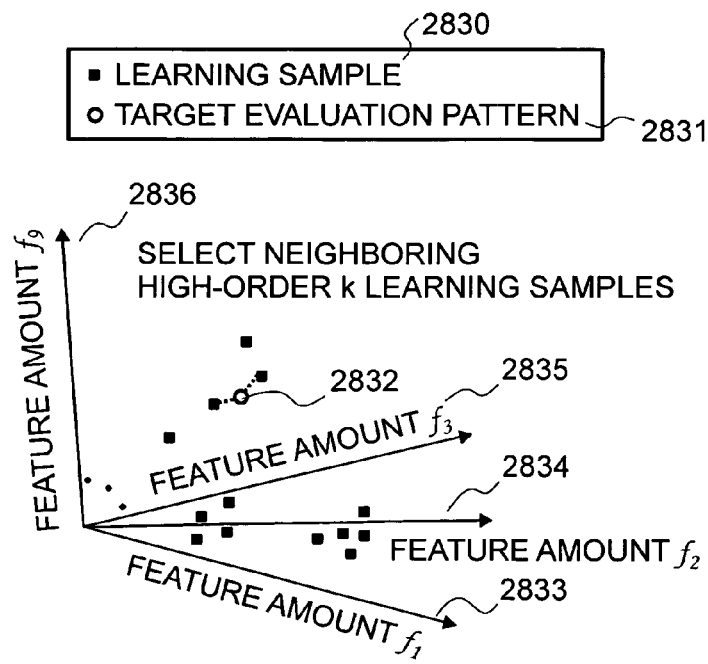
FIG. 24B is a diagram showing a distribution state of learning samples in a feature amount space.

FIG. 24B is a conceptual view in the event (2804) of selection of the high-order k learning samples near the target evaluation pattern in the feature amount space. In the present case, the number of image feature amounts is set to nine (f=(f1, ..., f9)T), and learning samples 2830 registered or stored are distributed in the feature amount space.

Then, high-order k learning samples of which a distance d(f,f') to a target evaluation pattern 2832 in the feature amount space are selected in accordance with the image feature amounts (f=(f1, ..., f9)T). The distance d(f,f') is given as a Euclidean distance by equation (6) below.

$$d(f, f') = \sqrt{\sum_{j=1}^{9} \{f_j - f'_j\}^2}$$

Numeric expression 6

A height H of the target evaluation pattern is calculated from the thicknesses of the selected k learning samples in accordance with an interpolation equation given as equation (7) below.

$$H = h_0 + \sum_{j=1}^{9} w_j f'_j$$

Numeric expression 7

In this case, wj and h0 are each calculated from the selected k learning samples in accordance with the least squares method.

In the manner described above, the pattern height of the semiconductor pattern, which is one example of the cross-sectional shape of the semiconductor pattern, can be estimated.

The above-described method of calculating cross-sectional shapes of target evaluation patterns in accordance with the k-NN scheme is an example of the method of calculating a cross-sectional shape of a target evaluation pattern by using the image feature amounts calculated from the SEM images of the target evaluation patterns. As in the method, the estimation process is performed by using all or some of the some image feature amounts exemplified above, thereby making it possible to calculate the cross-sectional shape of the pattern, or process conditions, or device characteristics.

(Configuration of the Present Invention)

A configuration for implementing a cross-sectional shape monitoring apparatus/method, process-condition monitoring apparatus/method, or device-characteristic monitoring apparatus/method according to the present invention will be described herebelow with reference to FIG. 17.

Components of the apparatus/method include a metrological SEM 2006, an image process/estimation process operation computer 2010, an AFM 2007 or a cross-sectional shape measurement general-purpose SEM 2008, a litho-simulator 2012, and an electron beam simulator 2013, and a database storage unit 2011. In addition, process-management target apparatuses include an exposure apparatus 2001, a development apparatus 2002, an etching apparatus 2003, and an exposure mask, in which the respective apparatuses are connected together across a network.

Figure 17:
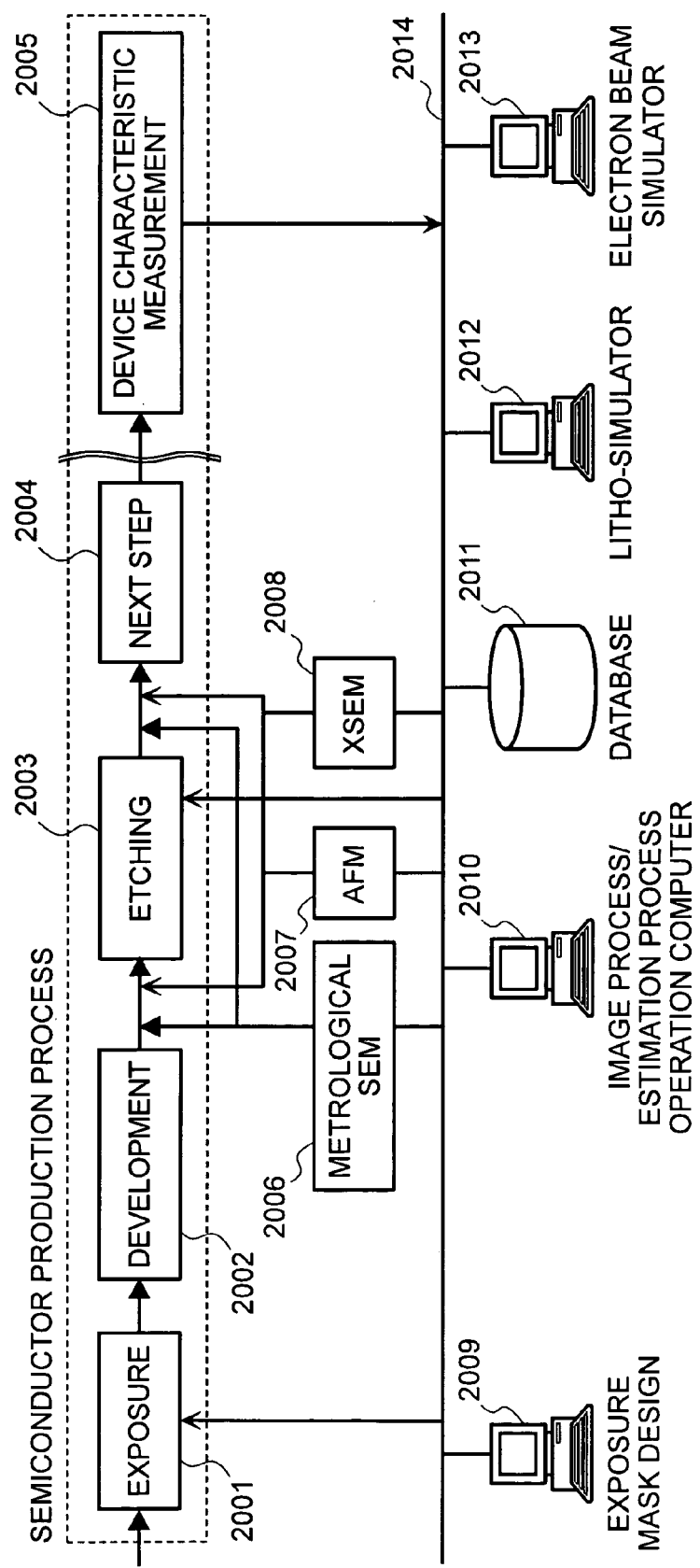
FIG. 17 is a diagram showing an embodiment of the configuration of the present invention.

The configuration shown in FIG. 17 can be such that an AFM-mounted metrological SEM is used in place of the metrological SEM and the cross-sectional shape measurement apparatuses. Thereby, the configuration is simplified, and the addressing of measurement target SEM images and cross-section measurement data is facilitated, therefore making it possible to efficiently perform measurement in the event of learning data creation.

(GUI)

Input GUI

Figure 18:
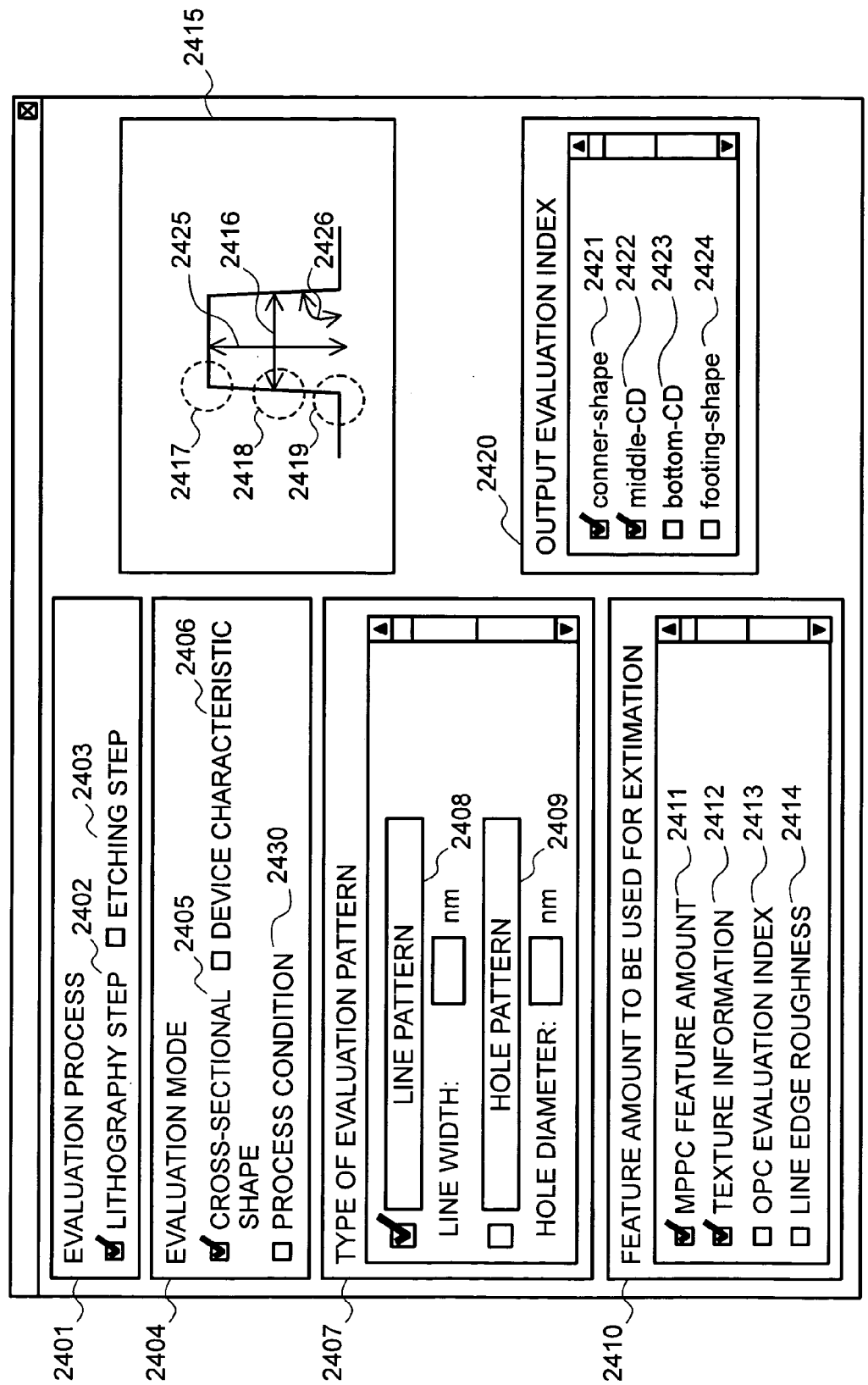
FIG. 18 is a view showing an embodiment of an input GUI.

FIG. 18 is an example of an input GUI (graphic user interface) screen in the cross-sectional shape monitoring apparatus/method, process-condition monitoring apparatus/method, or device-characteristic monitoring apparatus/method according to the present invention. The input GUI enables a user to provide various detail settings of semiconductor process monitoring through cross-sectional shape monitoring, process condition monitoring, or device characteristic monitoring. The apparatus/method according to the present invention has a feature that include, as the input GUI, all or some of below-described items enabling functions shown in the drawing to be selectable. The items enabling the selection will be described herebelow.

One of GUI items is an item 2401 for specifying a manufacturing step, which is an evaluation target, and the GUI item makes it possible to select a lithography step 2402, and etching step 2403. Another item is an item 2404 that makes it possible to select cross-sectional shape monitoring 2405, process condition monitoring 2430, and device-characteristic monitoring 2406. In addition, an item 2407 for specifying an evaluation pattern type makes it possible to input a line pattern width 2408 and a hole-pattern hole diameter 2409. An item 2410 for an image feature amount to be used for estimation makes it possible to select image feature amounts, such as an MPPC feature amount 2411, texture information 2412, an OPC evaluation index 2413, and a line edge roughness 2414. An item 2415 for specifying measurement points and for graphically displaying specified portions for cross-sectional shape monitoring makes it possible to display, for example, a height 2425, width 2416, corner portion shape 2417, sidewall shape 2418, footing portion shape 2419, sidewall tilt angle 2426 of an evaluation-pattern. An item 2420 for an output evaluation index 2420 in a monitoring event makes it possible to select, for example, a corner portion shape 2421, a top-CD/middle-CD 2422, bottom-CD 2423, and footing shape 2424.

All the items described above are selectable by a user. In addition, when some of the items have been selected, appropriate selection items can be set to be automatically selected. In addition, selection items can be set to automatically select representative measurement items to be automatically selected through leaning done in accordance with a past measurement history (For example, suppose that the evaluation process 2401 is the lithography step 2402, the evaluation mode 2404 is the cross-sectional shape 2405, and the evaluation pattern type 2407 is the line pattern 2408. In this case, as the image feature amount 2410 to be used for estimation, the MPPC feature amount 2411 is set to be automatically selected; and as the output indexes, the top-CD/middle-CD 2422 and the bottom-CD 2423 are set to be automatically selected).

The above-described monitoring apparatus/method associated with the GUI input functions enabling the user to set the various setting items is one example. By thus providing the user with the detail-setting method for the monitor, the user is enabled to address various process management requirements.

Output GUI

FIGS. 19 to 22 each show an example of an output GUI in the cross-sectional shape monitoring apparatus/method or device-characteristic monitoring apparatus/method in the present invention. With the output GUI, a user can perform detail and clear verification of detail monitoring results of semiconductor process monitoring through cross-sectional shape monitoring or device characteristic monitoring.

An output GUI screen shown in FIG. 19 is an example of a GUI for monitoring cross-sectional shapes of calculated patterns, and has a feature that include all or some of output items as shown hereinbelow. One of the items is an item for displaying an evaluation target process 2501, thereby to display a lithography step 2502 and etching step 2503. In addition, the screen includes an item for displaying an evaluation mode, thereby to display cross-sectional shape monitoring 2505, process condition monitoring 2530, and device-characteristic monitoring 2506. In addition, the screen includes an item for displaying an evaluation pattern type 2507, thereby to display, for example, a line pattern width and a hole pattern 2508.

In addition, the screen includes an item for displaying the calculation result of a cross-sectional shape being monitored, thereby to graphically display the calculated cross-sectional shape, and concurrently, to overlay display a respective measurement portion and the measurement result (2510). For example, there are displayed, for example, a pattern height 2511, width 2513, corner shape 2514, sidewall shape 2515, footing shape 2516, and sidewall tilt angle 2512. The screen also includes an item 2511 for displaying a calculated measurement value, thereby to display, for example, a measurement numeric value in the event of management of a middle-CD (2512). Further, a plurality of evaluation index values can be displayed in a side-by-side arrangement (2513).

The above-described various display items in the monitoring apparatus/method associated with the GUI input functions are examples. By thus enabling the user to display calculation results in detail, it becomes possible to provide the user with a clear process management status.

An GUI screen shown in FIG. 20 is an example of a GUI that displays a distribution of process-management evaluation index values on a wafer plane and that presents them to the user. In the case that, in place of the graphical display 2510 of calculated cross-sectional shapes among the display items described in conjunction with FIG. 19, evaluation index values are calculated in a plurality of portions on the wafer plane, the GUI displays a distribution of the evaluation values on the wafer plane (2610). Differences in the numeric values of the index values being displayed are represented by differences in the luminance values (2609), thereby to display the distribution on the wafer plane (2610). The evaluation indexes being displayed in this case are selectable (2612), and the plurality of index values can be selected (2613) from an evaluation index list (2611) to be overlay displayed. By thus displaying the index value distribution on the wafer plane, pattern cross-sectional shapes on the wafer plane or device characteristics can be monitored.

An output GUI screen shown in FIG. 22 is an example of a GUI for display a time variation in calculated process-management evaluation index values. In addition to the display items shown in FIG. 19, the GUI display a time variation in evaluation index values calculated from an evaluation pattern (2709). In the present example, time is set to the horizontal axis, and an evaluation index to be monitored is set to the vertical axis. An evaluation index to be displayed therein is selectable by the GUI (2711), and a plurality of evaluation indexes selected (2712) from the list (2711) can be displayed. The GUI is an example of a method of monitoring the time variation in the evaluation index value. By thus monitoring the time variation in the evaluation index, the user can any time monitor variations in the pattern forming state.

A GUI screen shown in FIG. 23 has a feature that displays a 3D shape of a calculated evaluation pattern. More specifically, in addition to the display items shown in FIG. 19, the GUI screen provides a 3D display of a 3D shape calculated from an evaluation pattern (2802). Further, with an evaluation process selection section 2801 provided on the same screen, an evaluation process can be specified. Furthermore, with an evaluation mode selection section 2803 is displayed to thereby enable the selection of an evaluation mode (3D shape or device characteristics) of a 3D display 2802 of a 3D shape displayed in an image display section 2805. Further, with a target evaluation pattern type selection section 2804 displayed, whereby the type of an evaluation pattern is selected, and the line width can be input.

The above-described GUI is an example of a method of displaying a cross-sectional shape calculated from an evaluation pattern. By thus providing the user with a 3D shape of the evaluation pattern, a pattern generation result can be presented intuitively and even more clearly to the user. Consequently, a defect, if any, in a generated pattern can early be detected.

The invention may be embodied in other specific forms without departing from the spirit or essential characteristics thereof. The present embodiment(s) is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method for semiconductor device production process monitoring, the method comprising the steps of:
   during the production process of the semiconductor device, obtaining a scanning electron microscopy (SEM) image of a target pattern formed on a sample through a predetermined process;
   obtaining a feature amount of the obtained SEM image of the target pattern;
   estimating a cross-sectional shape of the target pattern by comparing (a) the obtained feature amount of the obtained SEM image of the target pattern to (b) a database that preliminarily stores a first learning data representing correlations between (1) data of feature amounts of images obtained from SEM images obtained from various three-dimensional (3D) shape patterns, and (2) data obtained by measurement of cross-sectional shapes of the 3D shape patterns;
   estimating a process condition of the target pattern by comparing (a) the obtained feature amount of the SEM image of the target pattern to (c) a database that preliminarily stores a second learning data representing correlations between (1) data of feature amounts of images obtained from SEM images obtained from various 3D shape patterns, and (3) data of process conditions when the various 3D shape patterns are formed;
   determining whether the estimated cross-sectional shape of the target pattern satisfies a preliminarily set specification through comparison to the specification, and if the estimated cross-sectional shape of the target pattern does not satisfy the preliminarily set specification, calculating a process condition adjustment amount by using the estimated process condition of the target pattern;
   wherein the process condition adjustment amount provides feedback to the production process of the semiconductor device.

2. A method for semiconductor device production process monitoring, according to claim 1, wherein:
   the data of process conditions are stored into the database by being correlated to data obtained by measurement of cross-sectional shapes of the 3D shape and process conditions applied when the 3D shape pattern is formed.

3. A method for semiconductor device production process monitoring, according to claim 1, wherein the process conditions for forming the 3D shape pattern include at least one of focus positions, dose amounts, exposure time, baking temperatures, baking time in an exposure apparatus, intra-chamber temperatures, gas flow volumes, and gas pressure in an etching apparatus.

4. A method for semiconductor device production process monitoring, according to claim 1, wherein:
   the sample is monitored after an exposure step; and
   the method further comprises a step of providing feedback to the exposure step.

5. A method for semiconductor device production process monitoring, according to claim 1, wherein:
   the sample is monitored after an etching step; and
   the method further comprises a step of providing feedback to the etching step.

6. A method for semiconductor device production process monitoring, according to claim 1,
   wherein the step of estimating the cross-sectional shape of the target pattern includes the steps of:
   displaying a distribution of the data of feature amounts of images obtained from SEM images obtained from various three-dimensional shape patterns and the data obtained by measurement of cross-sectional shapes of the 3D shape patterns;
   selecting a estimation engine from a plurality of estimation engines to be used for estimating the cross-sectional shape of the target pattern by using the distribution.

7. A method for semiconductor device production process monitoring, according to claim 1,
   wherein the feature amount of the obtained SEM image of the target pattern is a texture feature amount.

8. A method for semiconductor device production process monitoring, according to claim 1,
   wherein the feature amount of the obtained SEM image of the target pattern is a differential line width feature amount.

9. An apparatus for semiconductor device production process monitoring, the apparatus comprising:
   an SEM image obtaining unit that, during the production process of the semiconductor device, obtains an SEM image of a target pattern formed on a sample through a predetermined process;
   a feature amount calculation unit that obtains a feature amount of the SEM image of the target pattern that has been obtained by the SEM image obtaining unit;
   a database unit that stores (1) data of feature amounts of images obtained from SEM images obtained from various 3D shape patterns, (2) data obtained by measurement of cross-sectional shapes of the 3D shape patterns to have correlation to one another, (3) data of process conditions when the various 3D shape patterns are formed, and data representing correlations between at least two of the other types of data;
   an estimation model comparison unit that adapts the feature amount obtained by the feature amount calculation unit to an estimation model determined through comparison to the data of the image feature amounts of the SEM images of the various 3D shape patterns, the data of the image feature amounts being preliminarily stored in the database so as to have correlation to the data obtained by measurement of the cross-sectional shapes of the 3D shape patterns;
   a cross-sectional shape estimation unit that estimates a cross-sectional shape of the target pattern in accordance with the estimation model to which the feature amount is adapted by the estimation model comparison unit;
   a determining unit that determines whether the cross-sectional shape of the target pattern, which is estimated by the cross-sectional shape estimation unit, satisfies a preliminarily set specification through comparison to the specification, and if the estimated cross-sectional shape of the target pattern does not satisfy the preliminarily set specification, estimating a process condition of the target pattern by comparing the obtained feature amount of the SEM image of the target pattern to the database unit that stores data representing correlations between the (1) data of feature amounts of images obtained from SEM images obtained from various 3D shape patterns, and the (3) data of process conditions when the various 3D shape patterns are formed; and a process condition adjustment amount calculating unit that calculates a process condition adjustment amount, and that uses the estimated process condition of the target pattern for providing feedback to the production process of the semiconductor device.

10. An apparatus for semiconductor device production process monitoring, according to claim 9, wherein:
the various 3D shape patterns to be stored into the database unit to have correlation to the data obtained by measurement of the cross-sectional shape are formed by varying process conditions for forming the 3D shape patterns; and
the feature amount of the SEM image of the target pattern is stored into the database by being correlated to data obtained by measurement of the cross-sectional shape of the 3D shape and process conditions applied when the 3D shape pattern is formed.

11. An apparatus for semiconductor device production process monitoring, according to claim 10, wherein the process conditions for forming the 3D shape pattern include at least of focus positions, dose amounts, exposure time, baking temperatures, baking time in an exposure apparatus, intra-chamber temperatures, gas flow volumes, and gas pressure in an etching apparatus.

12. An apparatus for semiconductor device production process monitoring, according to claim 9, wherein:
the predetermined process is an exposure step; and
the apparatus further comprises a feedback unit that feeds back a result of determination made by the determining unit to the exposure step.

13. An apparatus for semiconductor device production process monitoring, according to claim 9, wherein:
the predetermined process is an etching step; and
the apparatus further comprises feed back unit that feeds back a result of determination made by the determining unit to at least one of an exposure step which is performed prior to the etching step, and the etching step.

14. A method for estimating a cross sectional shape of a pattern, the method comprising the steps of:
obtaining an SEM image of a target pattern formed on a sample;
obtaining a feature amount of the obtained SEM image of the target pattern;
estimating a cross-sectional shape of the target pattern by comparing (a) the obtained feature amount of the obtained SEM image of the target pattern to (b) a database that preliminarily stores learning data representing correlations between (1) data of feature amounts of images obtained from SEM images obtained from various 3D shape patterns, (2) data obtained by measurement of cross-sectional shapes of the 3D shape patterns, and (3) data of process conditions when the various 3D shape patterns are formed;
estimating a cross-sectional shape of the target pattern in accordance with the estimation model to which the feature amount is adapted, and if said estimated cross-sectional shape of the target pattern does not satisfy a preliminarily set specification, estimating a process condition of the target pattern by comparing the obtained feature amount of the SEM image of the target pattern to correlation data stored in said database unit, said correlation data representing correlations between the (1) data of feature amounts of images obtained from SEM images obtained from various 3D shape patterns, and the (3) data of process conditions when the various 3D shape patterns are formed; and
calculating a process condition adjustment amount, that uses the estimated process condition of the target pattern for providing feedback to the production process of the semiconductor device.

15. A method for estimating a cross sectional shape of a pattern, according to claim 14, wherein:
in the step of adapting the feature amount to the estimation model, the various 3D shape patterns are formed by varying process conditions for forming the 3D shape patterns; and
the feature amount of the SEM image of the target pattern is stored into the database by being correlated to data obtained by measurement of the cross-sectional shape of the 3D shape and process conditions applied when the 3D shape pattern is formed.

16. A method for estimating a cross sectional shape of a pattern, according to claim 14, wherein, in the step of adapting the feature amount to the estimation model, the feature amount of the SEM image of the target pattern is stored into the database by being correlated to data obtained by measurement of the cross-sectional shape of the 3D shape and device characteristics of a circuit formed by using the 3D shape pattern.

17. A method for estimating a cross sectional shape of a pattern, according to claim 14, wherein:
in the step of adapting the feature amount to the estimation model, a plurality of candidates respectively including feature amounts of images that are similar to the feature amount of the SEM image of the target pattern are extracted; and
the cross-sectional shape of the 3D shape is estimated by using information of the feature amounts of the images of the plurality of candidates extracted.

18. A method for estimating a cross sectional shape of a pattern, according to claim 14, wherein the cross-sectional shape of the 3D shape pattern is estimated by using an estimation engine selected from a plurality of estimation engines.

19. A method for estimating a cross sectional shape of a pattern, according to claim 14, wherein, in the step of obtaining the SEM image of the target pattern, a tilt SEM image is obtained from the target pattern observed from a tilt direction.

20. An apparatus for estimating a cross sectional shape of a pattern, the apparatus comprising:
an SEM image obtaining unit that obtains an SEM image of a target pattern formed on a sample;
a database unit that stores (1) data of feature amounts of images obtained from SEM images obtained from various 3D shape patterns, (2) data obtained by measurement of cross-sectional shapes of the 3D shape patterns to have correlation to one another, and (3) data of process conditions when the various 3D shape patterns are formed;
an estimation model comparison unit that adapts the feature amount obtained by a feature amount calculation unit to an estimation model determined through comparison to the data of the image feature amounts of the SEM images of the various 3D shape patterns, the data of the image feature amounts being preliminarily stored in the database so as to have correlation to the data obtained by measurement of the cross-sectional shapes of the 3D shape patterns; and a cross-sectional shape estimation unit that estimates a cross-sectional shape of the target pattern in accordance with the estimation model to which the feature amount is adapted by the estimation model comparison unit; and a determining unit that determines whether the cross-sectional shape of the target pattern satisfies a preliminarily set specification, and if the estimated cross-sectional shape of the target pattern does not satisfy the preliminarily set specification, estimating a process condition of the target pattern by comparing the obtained feature amount of the SEM image of the target pattern to the database unit that stores data representing correlations between the (1) data of feature amounts of images obtained from SEM images obtained from various 3D shape patterns, and the (3) data of process conditions when the various 3D shape patterns are formed; and a process condition adjustment amount calculating unit that calculates a process condition adjustment amount, and that uses the estimated process condition of the target pattern for providing feedback to the production process of the semiconductor device.

21. An apparatus for estimating a cross sectional shape of a pattern, according to claim 20, wherein:

the various 3D shape patterns to be stored into the database unit to have correlation to the data obtained by measurement of the cross-sectional shape are formed by varying process conditions for forming the 3D shape patterns; and the feature amount of the SEM image of the target pattern is stored into the database by being correlated to data obtained by measurement of the cross-sectional shape of the 3D shape and process conditions applied when the 3D shape pattern is formed.

22. An apparatus for estimating a cross sectional shape of a pattern, according to claim 20, wherein the feature amount of the SEM image of the target pattern is stored into the database by being correlated to data obtained by measurement of the cross-sectional shape of the 3D shape and process conditions applied when the 3D shape pattern is formed.

23. An apparatus for estimating a cross sectional shape of a pattern, according to claim 20, wherein:

the estimation model comparison unit extracts a plurality of candidates respectively including feature amounts of images that are similar to the feature amount of the SEM image of the target pattern are extracted; and the cross-sectional shape estimation unit obtains the cross-sectional shape of the 3D by interpolating the feature amounts of the plurality of candidates extracted.

24. An apparatus for estimating a cross sectional shape of a pattern, according to claim 23, wherein the estimation model comparison unit comprises a plurality of estimation engines for estimating the cross-sectional shape of the 3D shape pattern and estimates the cross-sectional shape of the 3D shape pattern by using an estimation engine selected from the plurality of estimation engines.

25. An apparatus for estimating a cross sectional shape of a pattern, according to claim 20, wherein the SEM image obtaining unit obtains a tilt SEM image from the target pattern observed from a tilt direction.

26. An apparatus for estimating a cross sectional shape of a pattern, according to claim 20, the apparatus further comprising display unit that displays on a screen the cross-sectional shape of the target pattern in an arrangement with measurement values taken of a plurality of dimensional measurement portions of the cross-sectional shape.

27. A method for semiconductor device production process monitoring, the method comprising the steps of:

during the production process of the semiconductor device, obtaining an scanning electron microscopy (SEM) image of a target pattern formed on a sample through a predetermined process;

obtaining a feature amount of the obtained SEM image of the target pattern;

estimating a cross-sectional shape of the target pattern by comparing (a) the obtained feature amount of the SEM image of the target pattern to (b) a database that preliminarily stores a first learning data representing correlations between (1) data of feature amounts of images obtained from SEM images obtained from various three-dimensional (3D) shape patterns, and (2) data obtained by measurement of cross-sectional shapes of the 3D shape patterns;

determining whether the estimated cross-sectional shape of the target pattern satisfies a preliminarily set specification through comparison to the specification, and if the estimated cross-sectional shape of the target pattern does not satisfy the preliminarily set specification, estimating a process condition of the target pattern by comparing (a) the obtained feature amount of the SEM image of the target pattern to (c) a database that preliminarily stores a second learning data representing correlations between (1) data of feature amounts of images obtained from SEM images obtained from various 3D shape patterns, and (3) data of process conditions when the various 3D shape patterns are formed;

calculating a process condition adjustment amount by using the estimated process condition of the target pattern, the process condition adjustment amount being used for providing feedback to the production process of the semiconductor device.

* * * * *